(12) United States Patent
Chen et al.

(10) Patent No.: US 12,362,299 B2
(45) Date of Patent: Jul. 15, 2025

(54) BASIN-SHAPED UNDERBUMP PLATES AND METHODS OF FORMING THE SAME

(71) Applicant: Taiwan Semiconductor Manufacturing Company Limited, Hsinchu (TW)

(72) Inventors: Yen-Hao Chen, Taichung (TW); Han-Hsiang Huang, Hsinchu (TW); Yu-Sheng Lin, Zhubei (TW); Chien-Sheng Chen, Hsinchu (TW); Shin-Puu Jeng, Po-Shan Village (TW)

(73) Assignee: Taiwan Semiconductor Manufacturing Company Limited, Hsinchu (TW)

( * ) Notice: Subject to any disclaimer, the term of this patent is extended or adjusted under 35 U.S.C. 154(b) by 562 days.

(21) Appl. No.: 17/731,473

(22) Filed: Apr. 28, 2022

(65) Prior Publication Data
US 2023/0352428 A1    Nov. 2, 2023

(51) Int. Cl.
*H01L 23/00* (2006.01)
*H01L 21/48* (2006.01)
(Continued)

(52) U.S. Cl.
CPC .......... *H01L 24/05* (2013.01); *H01L 21/4857* (2013.01); *H01L 21/486* (2013.01); *H01L 23/49811* (2013.01); *H01L 23/49822* (2013.01); *H01L 23/49838* (2013.01); *H01L 24/03* (2013.01); *H01L 24/06* (2013.01); *H01L 24/96* (2013.01); *H01L 24/97* (2013.01); *H01L 25/0652* (2013.01); *H01L 23/49833* (2013.01); *H01L 24/16* (2013.01); *H01L 24/32* (2013.01); *H01L 24/73* (2013.01); *H01L 2224/03462* (2013.01); *H01L 2224/0362* (2013.01); *H01L 2224/03622* (2013.01);
(Continued)

(58) Field of Classification Search
CPC ..... H01L 24/04; H01L 24/05; H01L 21/4857; H01L 21/486; H01L 23/49838; H01L 24/06; H01L 24/96–97; H01L 25/0652; H01L 2224/0401; H01L 2224/06051; H01L 2224/16225–1624; H01L 2224/16155–16168; H01L 23/5386
See application file for complete search history.

(56) References Cited

U.S. PATENT DOCUMENTS

2008/0299757 A1\* 12/2008 Wen ................. H01L 24/05
  257/E21.476
2013/0134582 A1\* 5/2013 Yu ..................... H01L 23/49811
  257/737

\* cited by examiner

*Primary Examiner* — Aaron J Gray
*Assistant Examiner* — Warwick R Steer
(74) *Attorney, Agent, or Firm* — The Marbury Law Group, PLLC

(57) ABSTRACT

A semiconductor structure includes a semiconductor die containing an array of first bonding structures. Each of the first bonding structures includes a first metal pad located within a dielectric material layer and a basin-shaped underbump metallization (UBM) pad located within a respective opening in a passivation dielectric layer and contacting the first metal pad. An interposer includes an array of second bonding structures, wherein each of the second bonding structures includes an underbump metallization (UBM) pillar having a respective cylindrical shape. The semiconductor die is bonded to the interposer through an array of solder material portions that are bonded to a respective one of the first-type bonding structures and to a respective one of the second-type bonding structures.

20 Claims, 38 Drawing Sheets

(51) Int. Cl.
*H01L 23/498* (2006.01)
*H01L 25/065* (2023.01)

(52) U.S. Cl.
CPC ............... *H01L 2224/05005* (2013.01); *H01L 2224/05011* (2013.01); *H01L 2224/05013* (2013.01); *H01L 2224/05014* (2013.01); *H01L 2224/05015* (2013.01); *H01L 2224/05017* (2013.01); *H01L 2224/05073* (2013.01); *H01L 2224/05541* (2013.01); *H01L 2224/05551* (2013.01); *H01L 2224/05553* (2013.01); *H01L 2224/05554* (2013.01); *H01L 2224/05555* (2013.01); *H01L 2224/05557* (2013.01); *H01L 2224/05573* (2013.01); *H01L 2224/05647* (2013.01); *H01L 2224/0603* (2013.01); *H01L 2224/06051* (2013.01); *H01L 2224/06131* (2013.01); *H01L 2224/06133* (2013.01); *H01L 2224/16235* (2013.01); *H01L 2224/32225* (2013.01); *H01L 2224/73204* (2013.01); *H01L 2224/95001* (2013.01); *H01L 2924/1432* (2013.01); *H01L 2924/1437* (2013.01); *H01L 2924/182* (2013.01); *H01L 2924/186* (2013.01)

BASIN-SHAPED UNDERBUMP PLATES AND METHODS OF FORMING THE SAME

BACKGROUND

As dimensions of semiconductor devices scale down, the total number of electrical connections per unit area increases between a bonded pair of package structures, and correspondingly, the size of solder material portions decreases. Decrease in the size of the solder material portions may adversely impact the reliability of solder joints due to an accompanying decrease in the adhesion area between the solder material portions and each of the underbump structures.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1A:
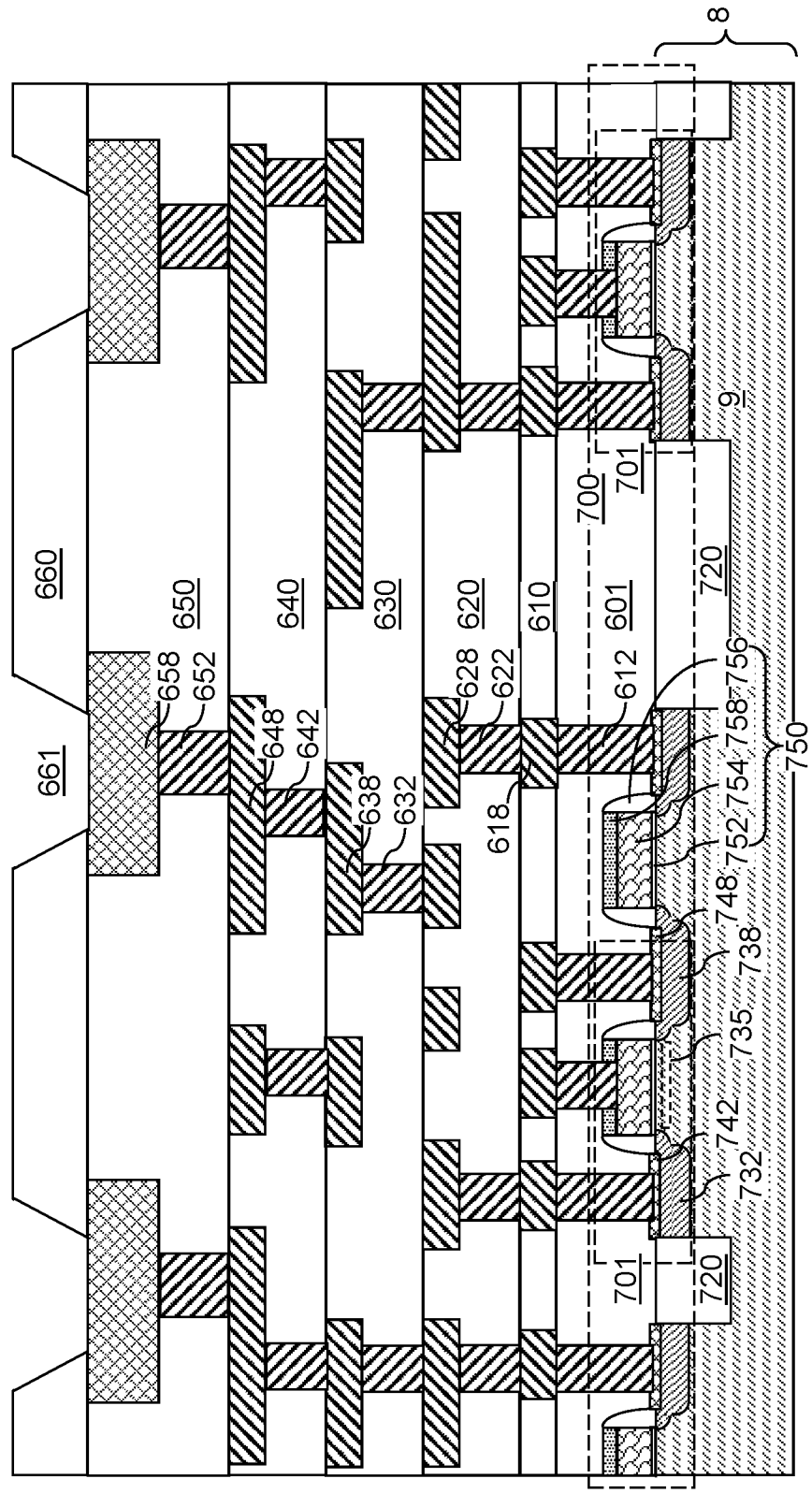
FIG. 1A is a vertical cross-sectional view of an exemplary semiconductor die after formation of complementary metal-oxide-semiconductor (CMOS) transistors, metal interconnect structures and dielectric material layers, a dielectric passivation layer, and taper-containing openings extending through the dielectric passivation layer according to an embodiment of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly. Unless explicitly stated otherwise, each element having the same reference numeral is presumed to have the same material composition and to have a thickness within a same thickness range.

The various embodiments disclosed herein are directed to semiconductor structures, and particularly to a semiconductor structures including at least one semiconductor die including basin-shaped underbump metallization pads an interposer including underbump metallization pillars that are bonded to each other through an array of solder material portions. Generally, the various embodiment methods and structures may be used to provide a chip package structure such as a fan-out wafer level package (FOWLP) and fan-out panel level package (FOPLP). While the present disclosure is described using an FOWLP configuration, the methods and structures of the present disclosure may be implemented in an FOPLP configuration or any other package configuration.

Figure 1B:
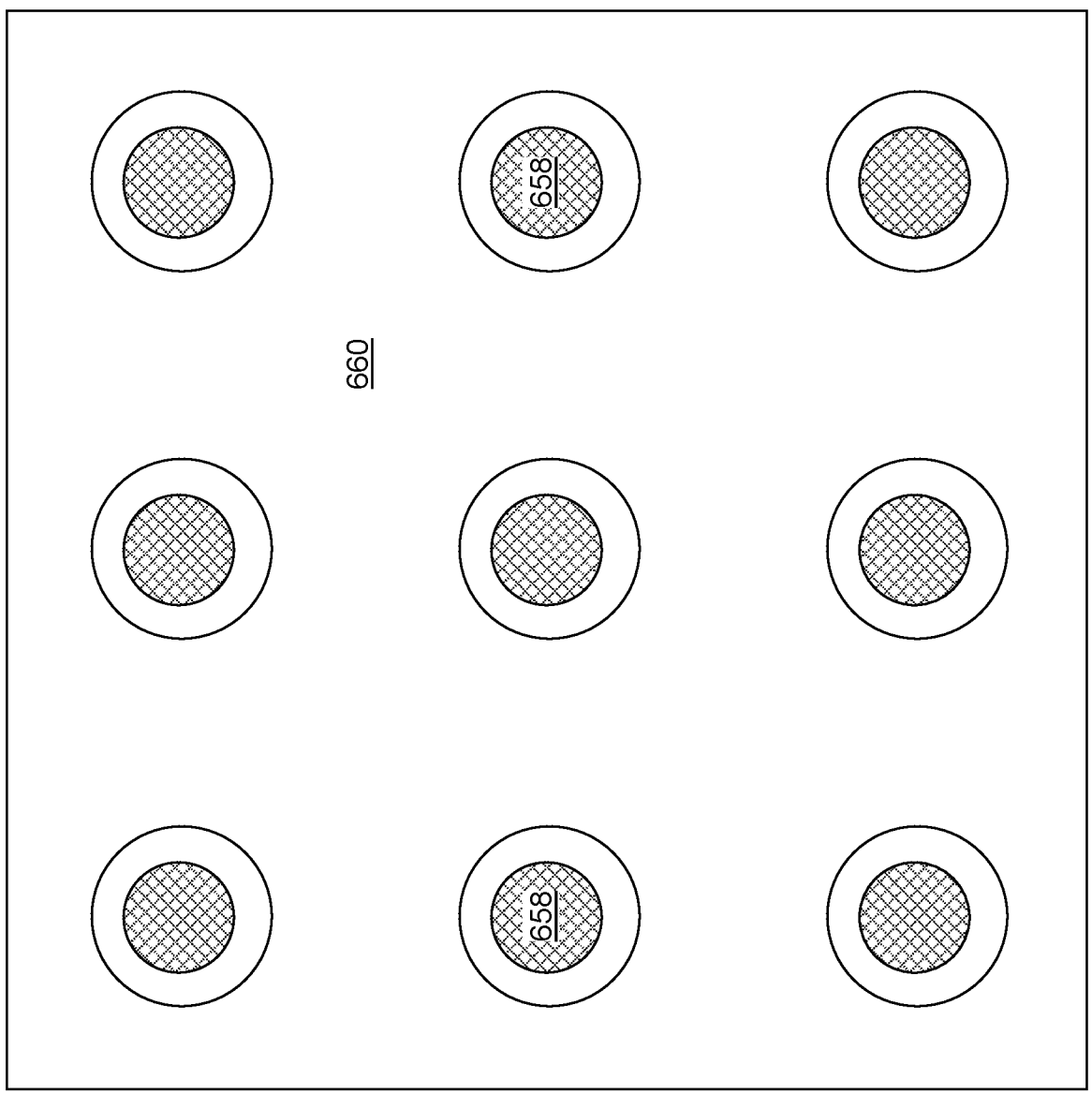
FIG. 1B is a top-down view of a region of the exemplary semiconductor die of FIG. 1A.

Referring to FIGS. 1A and 1B, an exemplary semiconductor die according to an embodiment of the present disclosure is illustrated. The exemplary semiconductor die includes a substrate 8, which may be a semiconductor substrate such as a commercially available silicon substrate. The substrate 8 may include a semiconductor material layer 9 at least at an upper portion thereof. The semiconductor material layer 9 may be a surface portion of a bulk semiconductor substrate, or may be a top semiconductor layer of a semiconductor-on-insulator (SOI) substrate. In one embodiment, the semiconductor material layer 9 includes a single crystalline semiconductor material such as single crystalline silicon. In one embodiment, the substrate 8 may include a single crystalline silicon substrate including a single crystalline silicon material.

Shallow trench isolation structures 720 including a dielectric material such as silicon oxide may be formed in an upper portion of the semiconductor material layer 9.

Suitable doped semiconductor wells, such as p-type wells and n-type wells, may be formed within each area that is laterally enclosed by a portion of the shallow trench isolation structures 720. Field effect transistors 701 may be formed over the top surface of the semiconductor material layer 9. For example, each field effect transistor 701 may include a source region 732, a drain region 738, a semiconductor channel 735 that includes a surface portion of the substrate 8 extending between the source region 732 and the drain region 738, and a gate structure 750. The semiconductor channel 735 may include a single crystalline semiconductor material. Each gate structure 750 may include a gate dielectric layer 752, a gate electrode 754, a gate cap dielectric 758, and a dielectric gate spacer 756. A source-side metal-semiconductor alloy region 742 may be formed on each source region 732, and a drain-side metal-semiconductor alloy region 748 may be formed on each drain region 738.

One or more of the field effect transistors 701 in the CMOS circuitry 700 may include a semiconductor channel 735 that contains a portion of the semiconductor material layer 9 in the substrate 8. In embodiments in which the semiconductor material layer 9 includes a single crystalline semiconductor material such as single crystalline silicon, the semiconductor channel 735 of each field effect transistor 701 in the CMOS circuitry 700 may include a single crystalline semiconductor channel such as a single crystalline silicon channel. In one embodiment, a plurality of field effect transistors 701 in the CMOS circuitry 700 may include a respective node that is subsequently electrically connected to a node of a respective memory cell to be subsequently formed. For example, a plurality of field effect transistors 701 in the CMOS circuitry 700 may include a respective source region 732 or a respective drain region 738 that is subsequently electrically connected to a node of a respective memory cell to be subsequently formed.

In one embodiment, the substrate 8 may include a single crystalline silicon substrate, and the field effect transistors 701 may include a respective portion of the single crystalline silicon substrate as a semiconducting channel. As used herein, a "semiconducting" element refers to an element having electrical conductivity in the range from $1.0 \times 10^{-6}$ S/cm to $1.0 \times 10^5$ S/cm. As used herein, a "semiconductor material" refers to a material having electrical conductivity in the range from $1.0 \times 10^{-6}$ S/cm to $1.0 \times 10^5$ S/cm in the absence of electrical dopants therein, and is capable of producing a doped material having electrical conductivity in a range from 1.0 S/cm to $1.0 \times 10^5$ S/cm upon suitable doping with an electrical dopant.

Various metal interconnect structures and dielectric material layers may be subsequently formed over the substrate 8 and the semiconductor devices (such as field effect transistors 701). In an illustrative example, the dielectric material layers may include, for example, a first dielectric material layer 601 (which is also referred to as a contact-level dielectric material layer 601) that surrounds device contact via structure 612 connected to the source regions 632, the drain regions 638, or the gate electrodes 754, a first interconnect-level dielectric material layer 610, a second interconnect-level dielectric material layer 620, a third interconnect-level dielectric material layer 630, a fourth interconnect-level dielectric material layer 640, and a topmost interconnect-level dielectric material layer 650 (which is a bonding-level dielectric material layer in the illustrated example). The metal interconnect structures may include device contact via structures 612 located in the first dielectric material layer 601 and contacting a respective component of the CMOS circuitry 700, first metal line structures 618 located in the first interconnect-level dielectric material layer 610, first metal via structures 622 located in a lower portion of the second interconnect-level dielectric material layer 620, second metal line structures 628 located in an upper portion of the second interconnect-level dielectric material layer 620, second metal via structures 632 located in a lower portion of the third interconnect-level dielectric material layer 630, third metal line structures 638 located in an upper portion of the third interconnect-level dielectric material layer 630, third metal via structures 642 located in a lower portion of the fourth interconnect-level dielectric material layer 640, fourth metal line structures 648 located in an upper portion of the fourth interconnect-level dielectric material layer 640, and topmost metal via structures 652 located in a lower portion of the topmost interconnect-level dielectric material layer 650. Bonding-level metal pads 658 (which are also referred to as first metal pads 658 or first bonding-level metal pads 658) may be formed in an upper portion of the topmost interconnect-level dielectric material layer 650.

Each of the dielectric material layers (601, 610, 620, 630, 640, 650) may include a dielectric material such as undoped silicate glass, a doped silicate glass, organosilicate glass, amorphous fluorinated carbon, porous variants thereof, or combinations thereof. Each of the metal interconnect structures (612, 618, 622, 628, 632, 638, 642, 648, 652) may include at least one conductive material, which may be a combination of a metallic liner (such as a metallic nitride or a metallic carbide) and a metallic fill material. Each metallic liner may include TiN, TaN, WN, TiC, TaC, and WC, and each metallic fill material portion may include W, Cu, Al, Co, Ru, Mo, Ta, Ti, alloys thereof, and/or combinations thereof. Other suitable metallic liner and metallic fill materials within the contemplated scope of disclosure may also be used. In one embodiment, the first metal via structures 622 and the second metal line structures 628 may be formed as integrated line and via structures by a dual damascene process. Generally, any contiguous set of a metal line structure (628, 638, 648) and at least one underlying metal via structure (622, 632, 642) may be formed as an integrated line and via structure. Additional dielectric material layers (not shown) and additional metal interconnect structures (not shown) may be formed between the fourth interconnect-level dielectric material layer 640 and the topmost interconnect-level dielectric material layer 650.

According to an embodiment of the present disclosure, each of the first bonding pads 658 may comprise a respective metal portion consisting essentially of copper, or aluminum, or an elemental metal or a metallic alloy that may be used for bonding. Generally, the first bonding pads 658 may be formed in an upper portion of the topmost interconnect-level dielectric layer 650 (which is the bonding-level dielectric material layer) by forming pad cavities within the upper portion of the topmost interconnect-level dielectric layer 650, filing the pad cavities with copper or aluminum, and removing portions of copper or aluminum from above the horizontal plane including the top surface of the topmost interconnect-level dielectric layer 650. As such, top surfaces of the first bonding pads 658 may be located within the horizontal plane including the top surface of the topmost interconnect-level dielectric layer 650. The periodicity of the first bonding pads 658 may be the same as the periodicity of die-side bonding structures that are subsequently formed on the semiconductor die.

According to an aspect of the present disclosure, a passivation dielectric layer 660 may be formed over the first metal pads 658 and the topmost interconnect-level dielectric material layer 650. The passivation dielectric layer 660 may comprise silicon nitride and/or photosensitive polyimide. The thickness of the passivation dielectric layer 660 may be in a range from 100 nm to 10,000 nm, such as from 300 nm to 3,000 nm, although lesser and greater thicknesses may also be used.

Taper-containing openings 661 may be formed through the passivation dielectric layer 660 such that a central segment of a top surface of a first bonding pad 658 may be physically exposed underneath each taper-containing opening 661. As used herein, a taper-containing opening 661 refers to an opening including at least one tapered surface, i.e., a surface at a non-zero and non-orthogonal angle with respect to a horizontal plane. In one embodiment, the taper-containing openings 661 may be formed by applying and patterning a photoresist layer (not shown) over the passivation dielectric layer 660, and by etching portions of the passivation dielectric layer 660 that are not masked by the photoresist layer such that each opening through the passivation dielectric layer 660 is formed with a respective tapered surface. Alternatively, in embodiments in which the passivation dielectric layer 660 comprises photosensitive polyimide, the passivation dielectric layer 660 may be patterned by lithographic exposure and development, and an etch process may be optionally performed to form the taper-containing openings 661. In one embodiment, each tapered surface may have a same taper angle (as measured relative to a vertical direction). Generally, the tapered surface (which is a tapered segment of a contoured top surface of the passivation dielectric layer 660) of each taper-containing opening 661 may have an inner periphery (which is a bottom periphery) contacting a top surface of a respective first bonding pad 658 and an outer periphery (which is a top periphery) adjoined to a horizontally-extending surface segment of the contoured top surface of the passivation dielectric layer 660.

The depth of the taper-containing openings 661 may be the same as the thickness of the passivation dielectric layer 660, and thus, may be in a range from 100 nm to 10,000 nm, such as from 300 nm to 3,000 nm, although lesser and greater depths may also be used. The taper-containing openings 661 may be arranged in a two-dimensional array configuration. Additionally or alternatively, the taper-containing openings 661 may be arranged in at least one one-dimensional array laterally extending along any horizontal direction. Optionally, the first bonding pads 658 and/or the taper-containing openings 661 may be elongated along one horizontal direction and/or may have a polygonal shape. Generally, each of the first bonding pads 658 and/or the taper-containing openings 661 may have a respective shape of a circle, an oval, or a polygon in a plan view, which is a view along the vertical direction.

Figure 2:
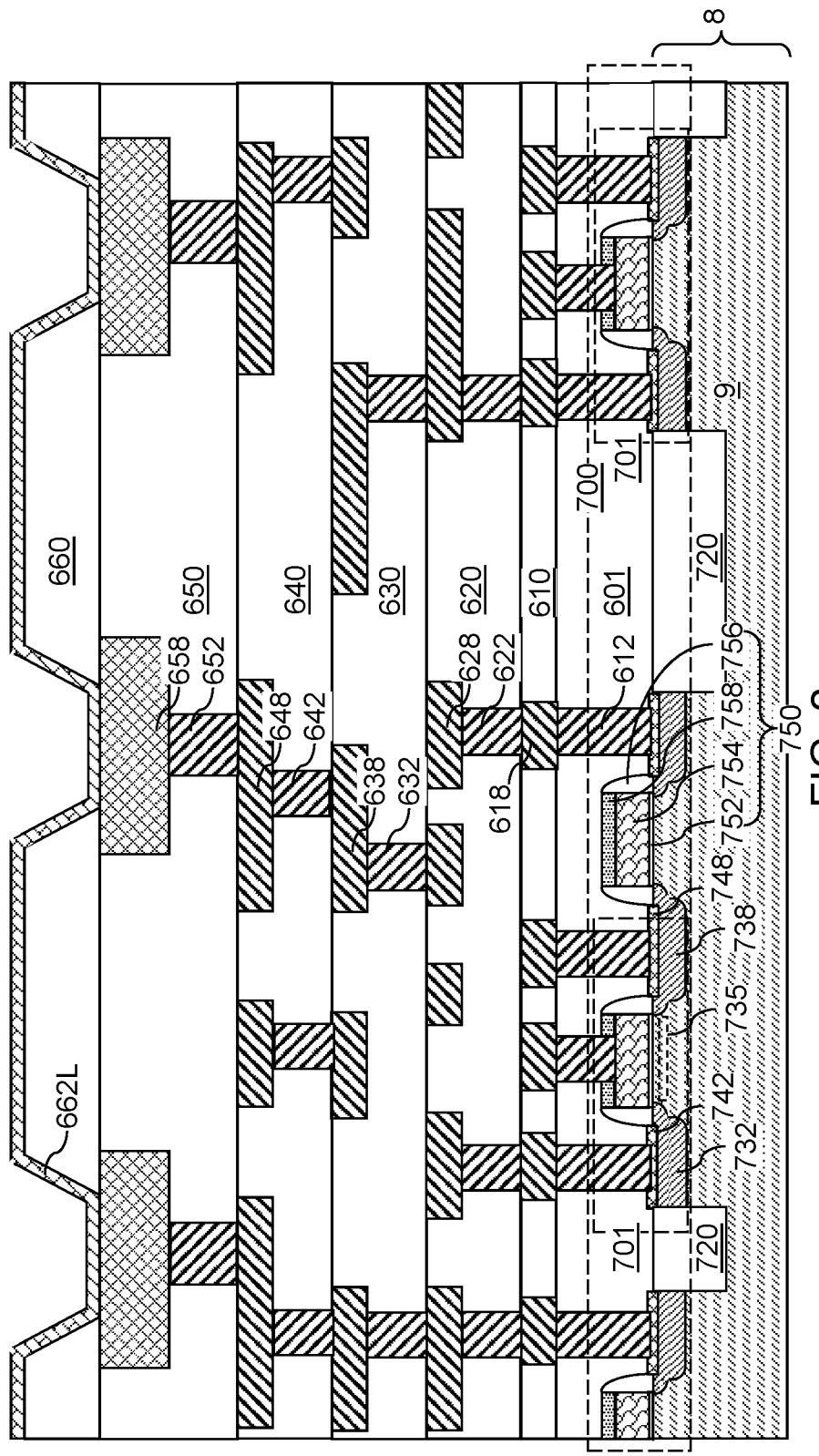
FIG. 2 is a vertical cross-sectional view of the exemplary semiconductor die after formation of a non-copper metallization material layer according to an embodiment of the present disclosure.

Referring to FIG. 2, a non-copper metallization material layer 662L may be deposited over the first bonding pads 658 and the passivation dielectric layer 660 using at least one non-selective deposition process. The non-copper metallization material layer 662L includes at least one metal which is not copper and may be used in conjunction with copper to provide an underbump metallization stack. In a non-limiting example, the non-copper metallization material layer 662L may comprise a nickel layer, a layer stack including a gold layer and a nickel layer, a layer stack including a titanium layer and a nickel layer, a layer stack including a TiW layer and a nickel layer, a layer stack including a gold layer, a palladium layer, and a nickel layer, or any other underbump metallization stack as known in the art. The at least one non-selective deposition process may comprise physical vapor deposition and/or chemical vapor deposition. The thickness of the non-copper metallization material layer 662L may be in a range from 30 nm to 3 microns, although lesser and greater thicknesses may also be used.

Figure 3:
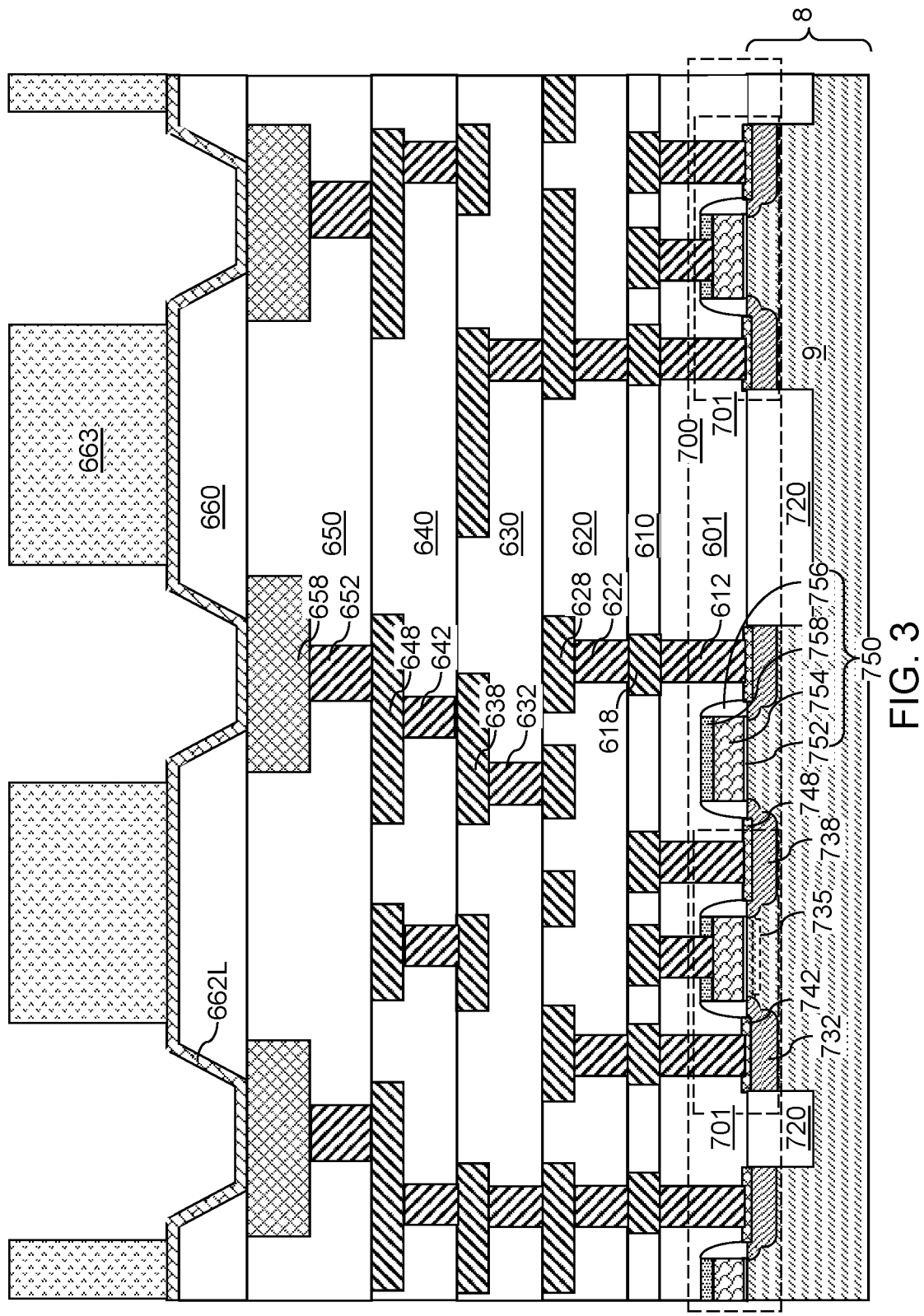
FIG. 3 is a vertical cross-sectional view of the exemplary semiconductor die after formation of a patterned photoresist layer according to an embodiment of the present disclosure.

Referring to FIG. 3, a patterned photoresist layer 663 may be formed over the non-copper metallization material layer 662L. The patterned photoresist layer 663 may be formed by applying a photoresist material over the non-copper metallization material layer 662L and by lithographically patterning the photoresist material such that an opening is formed over each area of the taper-containing openings in the passivation dielectric layer 660. In one embodiment, each periphery of an opening in the patterned photoresist layer 663 may be formed at, or outside, a top periphery of a respective taper-containing opening in the passivation dielectric layer 660. Generally, the patterned photoresist layer 663 may include an array of openings that overlie the taper-containing openings in the passivation dielectric layer 660.

Figure 4:
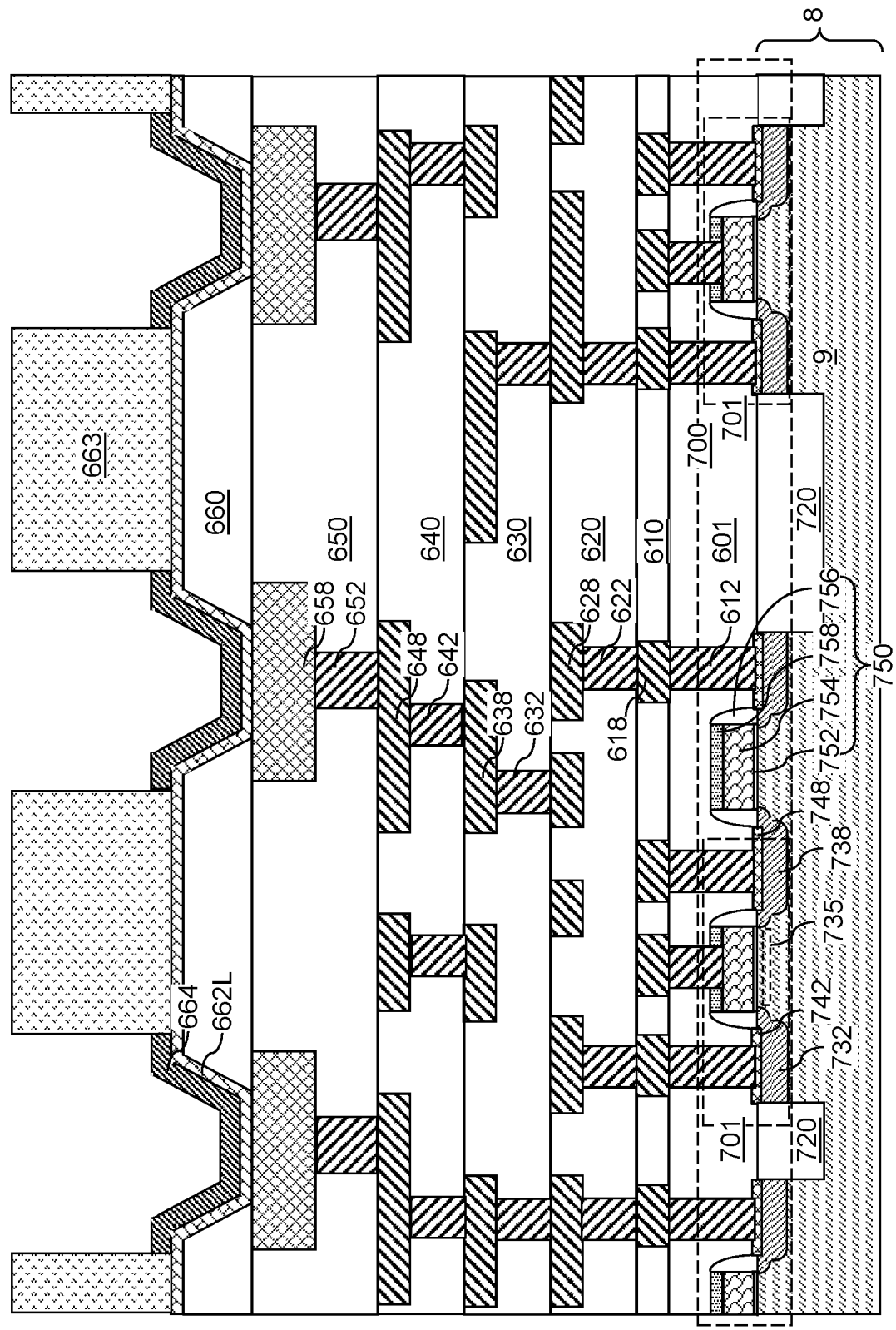
FIG. 4 is a vertical cross-sectional view of the exemplary semiconductor die after formation of basin-shaped copper plates according to an embodiment of the present disclosure.

Referring to FIG. 4, a copper plating process may be performed to selectively plate copper on physically exposed surfaces of the non-copper metallization material layer 662L. Copper may be plated on portions of the non-copper metallization material layer 662 that are not masked by the patterned photoresist layer 663. Due to the tapered and recessed geometry of the physically exposed portions of the non-copper metallization material layer 662L, each plated portion of copper forms a basin-shaped copper plate 664. As used herein, a "basin-shaped" element refers to an element having a general shape of a basin, i.e., a shape having a recessed center portion and a raised rim portion that encircles the recessed center portion. The thickness of the basin-shaped copper plate 664 may be in a range from 60 nm to 6,000 nm, such as from 300 nm to 3,000 nm, although lesser and greater thicknesses may also be used.

Figure 5:
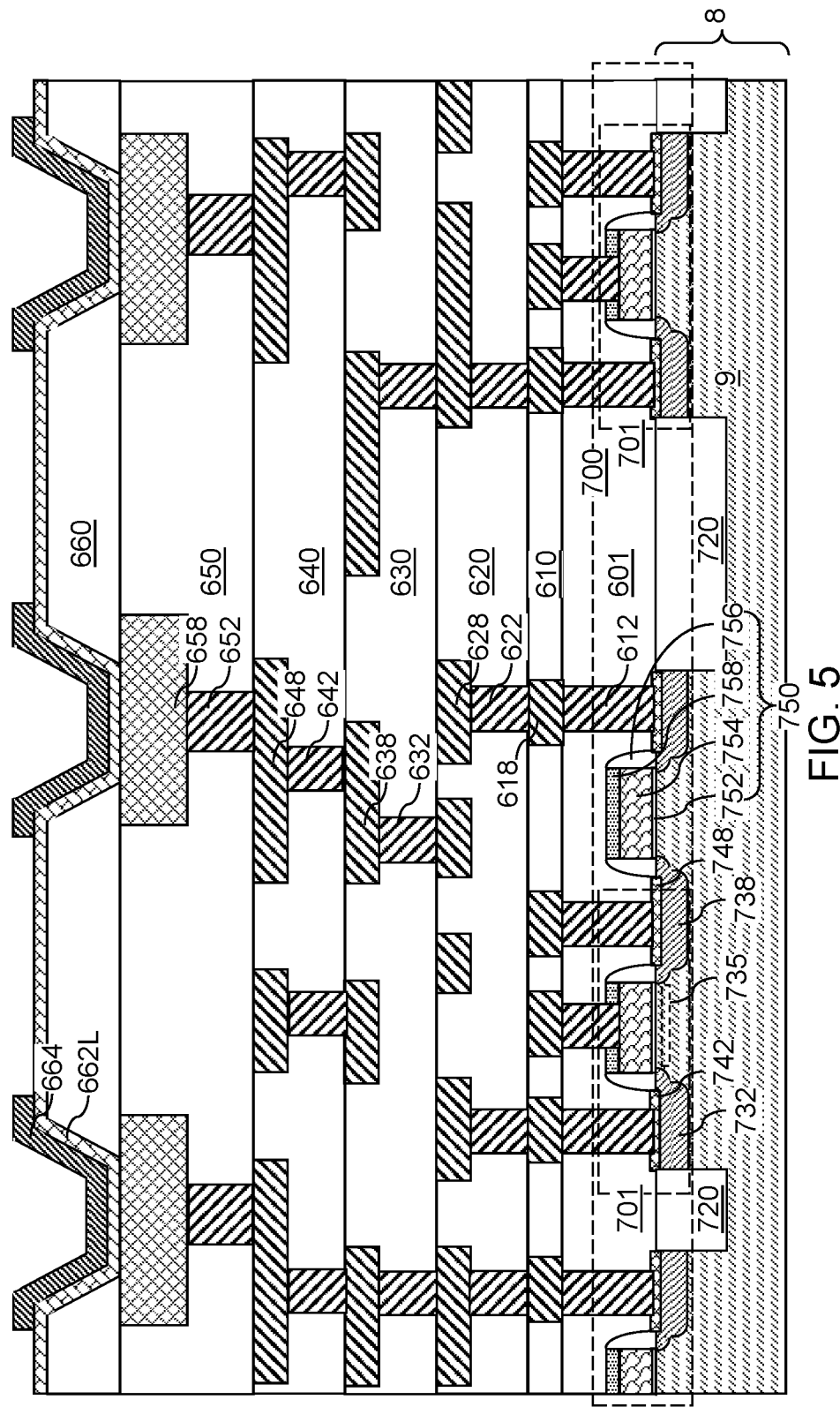
FIG. 5 is a vertical cross-sectional view of the exemplary semiconductor die after removal of the patterned photoresist layer according to an embodiment of the present disclosure.

Referring to FIG. 5, the patterned photoresist layer 663 may be removed selective to the basin-shaped copper plates 664 and the non-copper metallization material layer 662, for example, by ashing.

Figure 6:
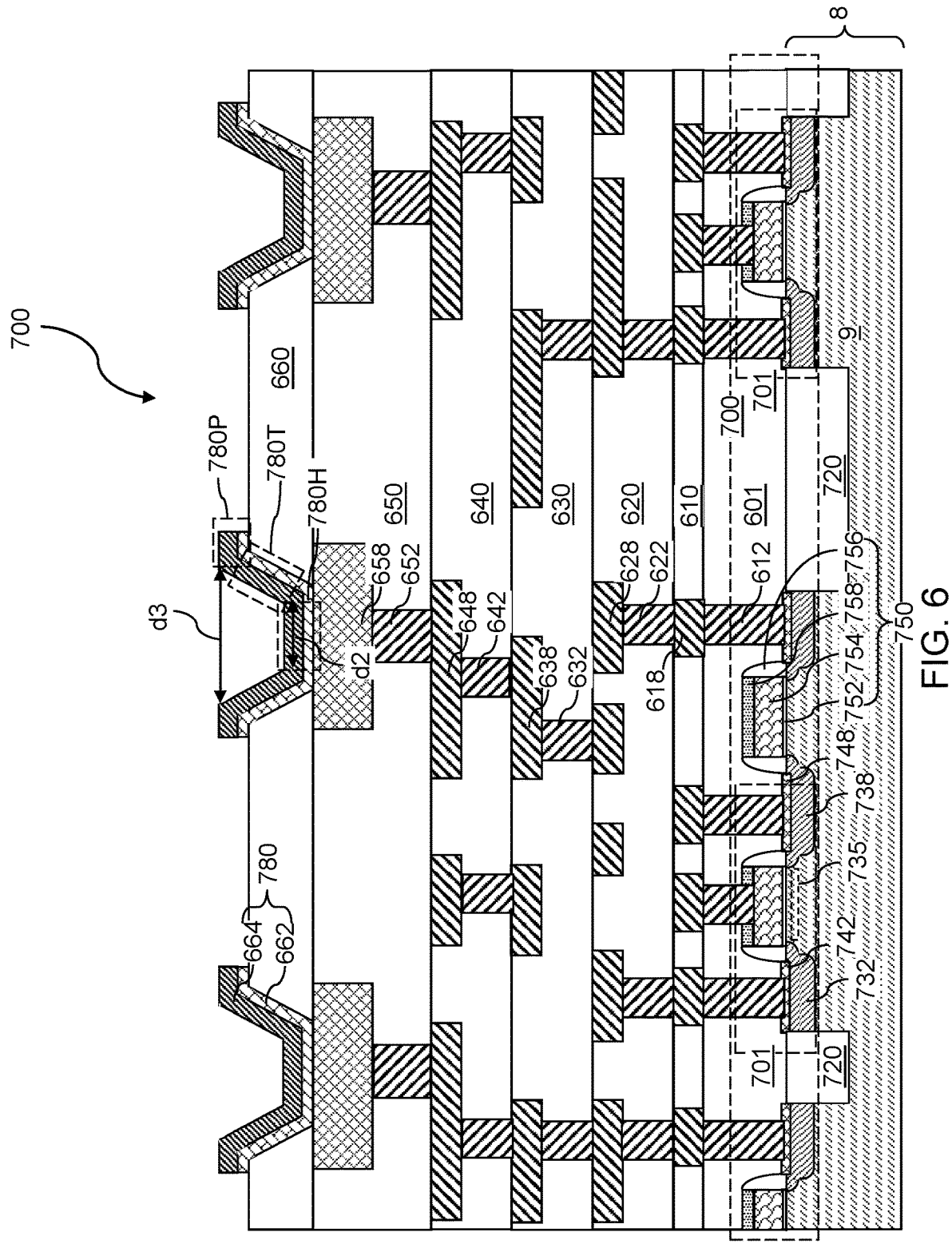
FIG. 6 is a vertical cross-sectional view of the exemplary semiconductor die after removal of unmasked portions of the non-copper metallization material layer according to an embodiment of the present disclosure.

Referring to FIG. 6, portions of the non-copper metallization material layer 662L that are not masked by the basin-shaped copper plates 664 located over the taper-containing openings may be removed by an etch process. The etch process may comprise an anisotropic etch process (such as a reactive ion etch process) or an isotropic etch process (such as a wet etch process). The etch process may be selective to the copper material of the basin-shaped copper plates 664. Each patterned remaining portion of the non-copper metallization material layer 662L constitutes a non-copper metallization material plate 662. Each contiguous combination of a non-copper metallization material plate 662 and a basin-shaped copper plate 664 constitutes a basin-shaped UBM pad 780. Each basin-shaped UBM pad 780 may be formed on a respective one of the first metal pads 658 and in a respective one of the taper-containing openings 661 through the passivation dielectric layer 660.

Each contiguous combination of a first metal pad 658 selected from the first metal pads 658 and a basin-shaped UBM pad 780 selected from the basin-shaped UBM pads 780 constitute a first bonding structure (658, 780), which is also referred to as a die-side bonding structure (658, 780).

Each basin-shaped UBM pad 780 may comprise a horizontally-extending portion 780H having a uniform thickness and contacting the respective one of the first metal pads 658, a taper-containing portion 780T adjoined to a periphery of the horizontally-extending portion 780H and contacting a tapered surface segment of the passivation dielectric layer 660 that is a tapered portion of the contoured surface of the passivation dielectric layer 660, and a peripheral plate portion 780P adjoined to an outer periphery of the taper-containing portion 780T and contacting an annular segment of a horizontally-extending portion of the contoured surface of the passivation dielectric layer 660.

In one embodiment, UBM pillars on an interposer (not shown) to be subsequently used may have a respective maximum lateral extent of a first dimension. In one embodiment, the horizontally-extending portion 780H of the basin-shaped UBM pad 780 within each of the first bonding structures (658, 780) (i.e., each of the die-side bonding structures (658, 780)) may have a maximum lateral extent of a second dimension d2, and an inner periphery of the peripheral plate portion 780P of the basin-shaped UBM pad 780 may be adjoined to a periphery of the taper-containing portion 780T of the basin-shaped UBM pad 780, and may have a maximum lateral extent of a third dimension d3. In one embodiment, the ratio of the third dimension to the second dimension may be in a range from 1.1 to 2.0. In one embodiment, a straight tapered surface may extend from the periphery of the horizontally-extending portion of the basin-shaped UBM pad 780H to the inner periphery of the peripheral plate portion 780P of the basin-shaped UBM pad 780.

A plurality of semiconductor dies may be provided using the methods described with reference to FIGS. 1A, 1B, 2, 3, 4, 5, and 6. In an illustrative example, the plurality of semiconductor dies may comprise at least one system-on-chip (SoC) die 700.

Figure 7:
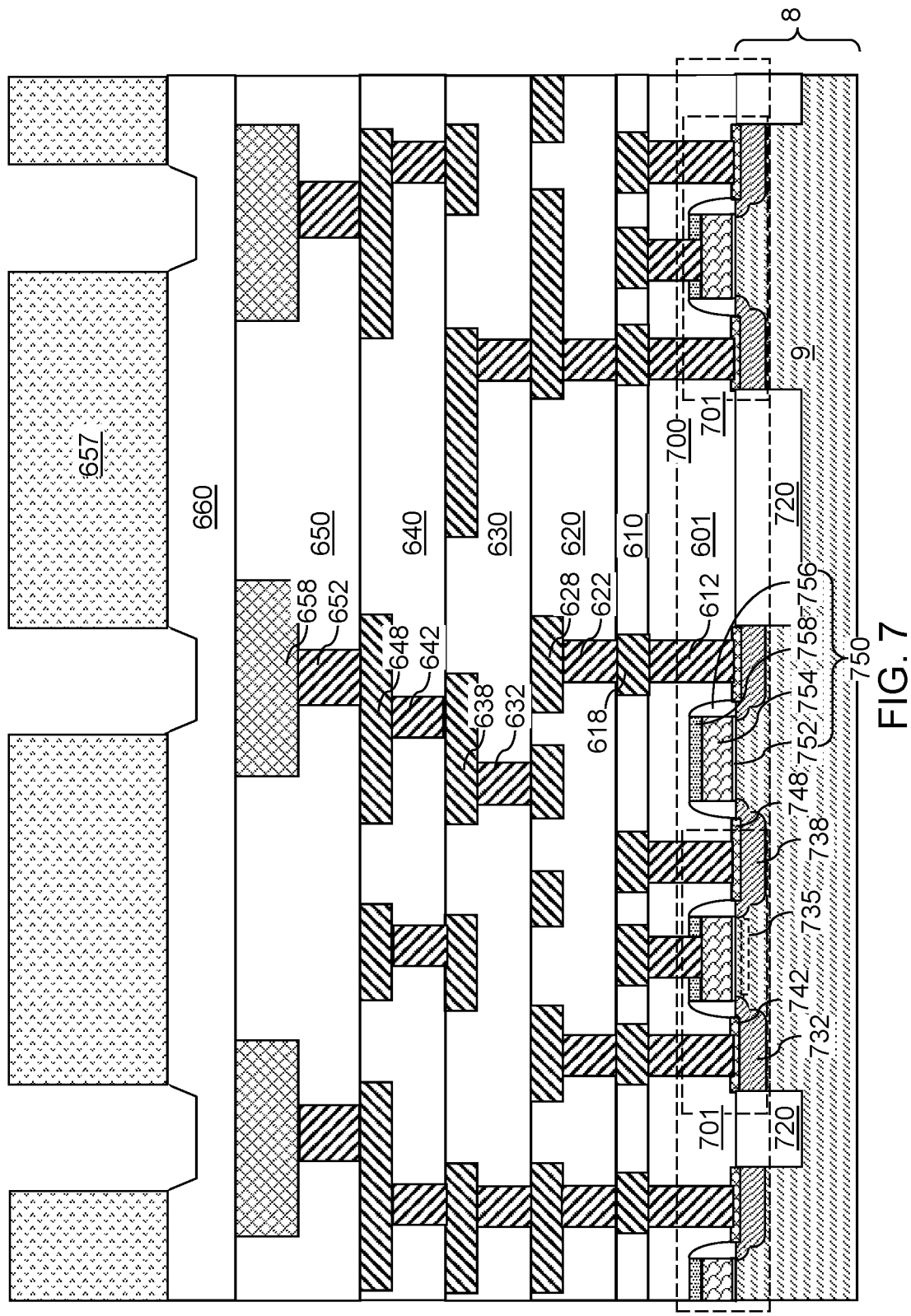
FIG. 7 is a vertical cross-sectional view an alternative configuration of the exemplary semiconductor die after formation of first recess regions in an upper portion of the passivation dielectric layer according to an embodiment of the present disclosure.

Referring to FIG. 7, an alternative configuration of the exemplary semiconductor die according to an embodiment of the present disclosure may be derived from the exemplary semiconductor die illustrated in FIGS. 1A and 1B by modifying the patterning process for forming taper-containing openings in the passivation dielectric layer 660. For example, a photoresist layer 657 may be applied over the passivation dielectric layer 660, and may be lithographically patterned to form openings that are smaller in size than the taper-containing openings 661 illustrated in FIGS. 1A and 1B. A first etch process may be performed to form first recess regions in an upper portion of the passivation dielectric layer 660 such that the bottom surfaces of the first recess regions are recessed portions of the contoured surface of the passivation dielectric layer 660. The depth of recess for the first recess regions may be in a range from 10% to 90%, such as from 20% to 80%, of the thickness of the passivation dielectric layer 660.

Figure 8:
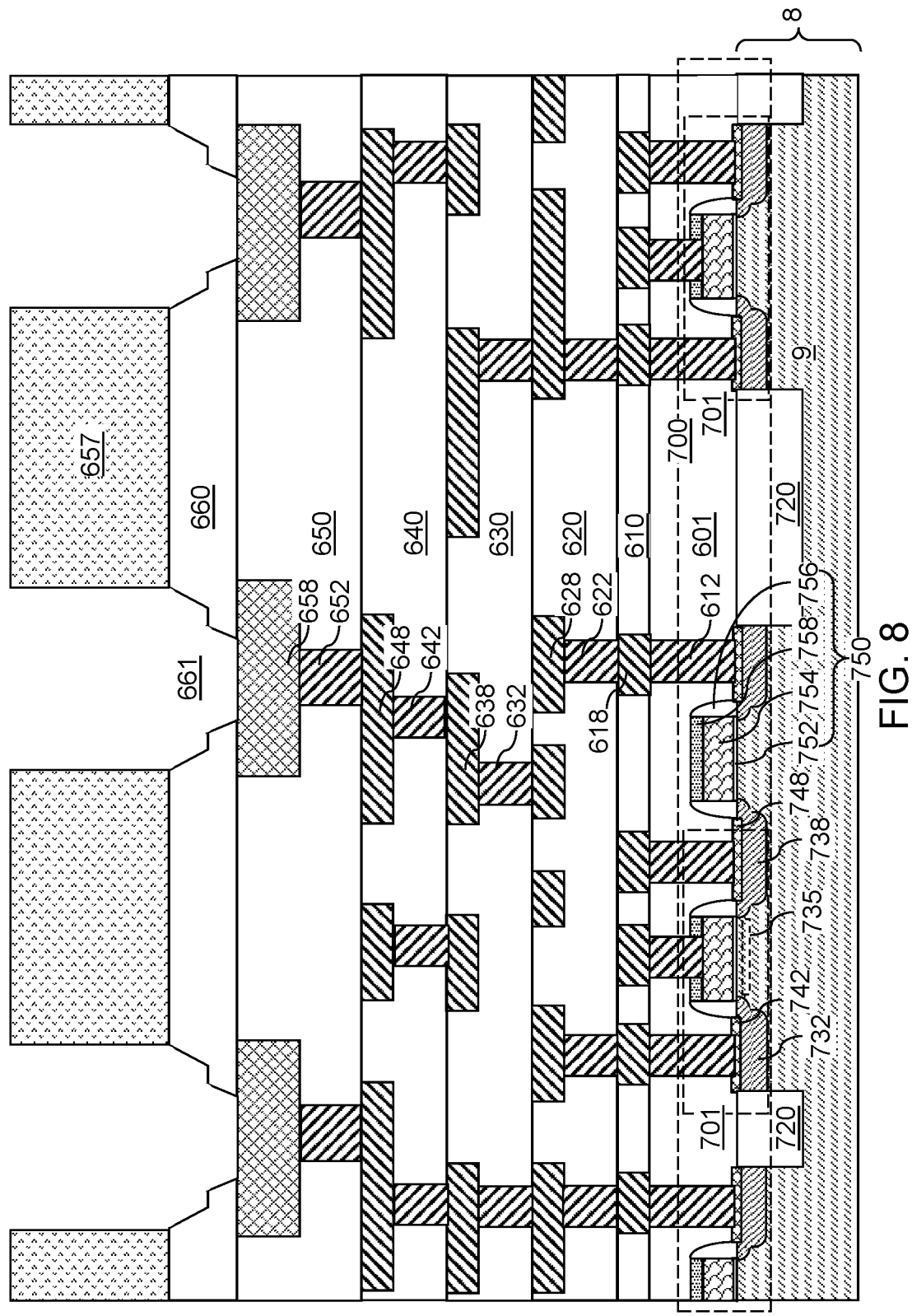
FIG. 8 is a vertical cross-sectional view of the alternative configuration of the exemplary semiconductor die after formation of stepped taper-containing openings in the passivation dielectric layer according to an embodiment of the present disclosure.

Referring to FIG. 8, the photoresist layer 657 may be isotropically trimmed to increase the size of each opening therein. A second etch process may be performed to isotropically or anisotropically recess unmasked portions of the passivation dielectric layer 660. Taper-containing openings 661 may be formed in volumes from which the material(s) of the passivation dielectric layer 660 is removed. A central segment of a top surface of a first bonding pad 658 may be physically exposed at the bottom of each taper-containing opening 661. In one embodiment, the taper-containing openings 661 may be formed as stepped taper-containing openings. Specifically, one, a plurality, or each of the taper-containing openings 661 may be formed with a pair of annular tapered surface segments adjoined to each other by an annular horizontal surface segment. As used herein, an annular element refers to an element including an opening therein. Thus, an annular surface segment includes an outer periphery that is offset outward from an inner periphery. The photoresist layer 657 may be subsequently removed, for example, by ashing.

Figure 9:
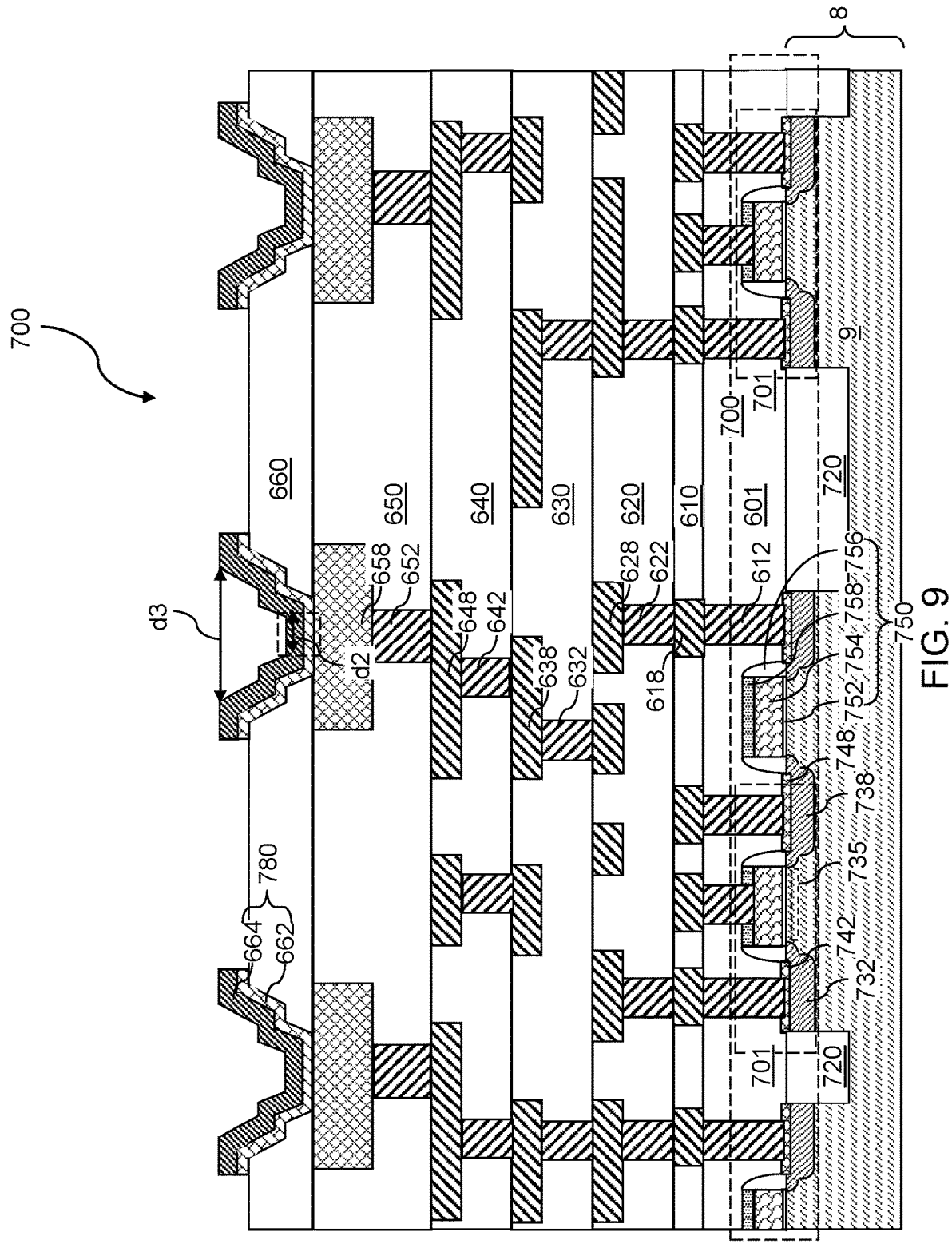
FIG. 9 is a vertical cross-sectional view of the exemplary semiconductor die after formation of basin-shaped under bump metallization (UBM) pads according to an embodiment of the present disclosure.
Figure 10A:
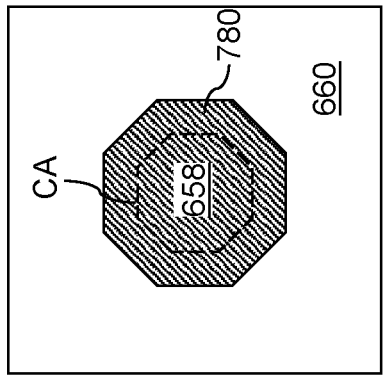
FIGS. 10A-10D illustrate various shapes for basin-shaped UBM pads according to various embodiments of the present disclosure.
Figure 10B:
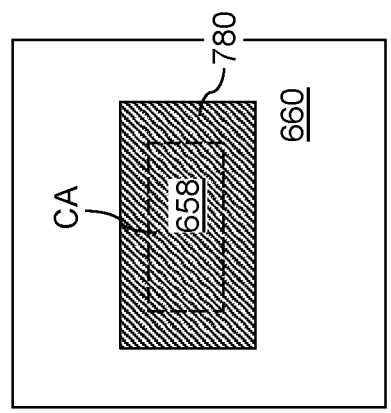
Figure 10C:
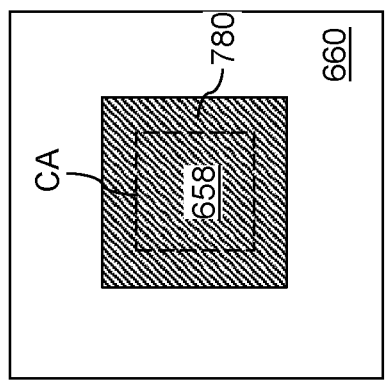
Figure 10D:
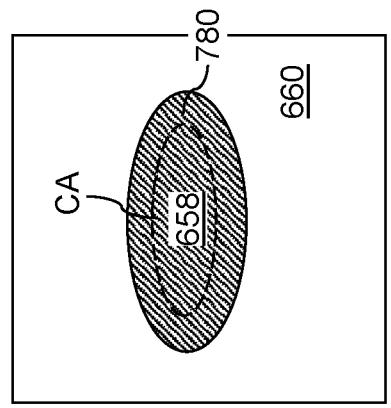

Referring to FIG. 9, the processing steps of FIGS. 2-6 may be performed to form an array of basin-shaped UBM pads 780.

Referring collectively to FIGS. 6 and 9, the basin-shaped underbump metallization (UBM) pads 780 may be formed on a respective one of the first metal pads 658 in a respective one of the taper-containing openings through the passivation dielectric layer 660. Each contiguous combination of a first metal pad 658 selected from the first metal pads 658 and a basin-shaped UBM pad 780 selected from the basin-shaped UBM pads 780 constitute a first bonding structure (658, 780), which is also referred to as a die-side bonding structure (658, 780).

At least one semiconductor die may be provided. Each semiconductor die may comprise an array of first bonding structures (658, 780). Each of the first bonding structures (658, 780) comprises a first metal pad 658 located within a dielectric material layer (such as a bonding-level dielectric material layer 650) and a basin-shaped UBM pad 780 located within a respective opening 661 in the passivation dielectric layer 660 and contacting the first metal pad 658. In one embodiment, the basin-shaped UBM pad 780 within each of the first bonding structures (658, 780) comprises a layer stack including a basin-shaped copper plate 664 (which is also referred to as a copper plate 664), and a non-copper metallization material plate 662 in contact with the basin-shaped copper plate 664. One, a plurality, or each, of the basin-shaped UBM pads 780 may comprise at least one tapered surface that contacts a respective tapered surface segment of the passivation dielectric layer 660.

In one embodiment, a horizontal surface of the first metal pad 658 of each of the first bonding structures (658, 780) may comprise a first horizontal surface segment in contact with a horizontal bottom surface of the basin-shaped UBM pad 780 within a respective one of the first bonding structures (658, 780), and a second horizontal surface segment that is complement of the first horizontal surface segment and is in contact with a surface segment of the passivation dielectric layer 660. In one embodiment, the second horizontal surface segment may enclose the first horizontal surface segment.

Generally, each basin-shaped UBM pad 780 may have any two-dimensional curvilinear shape having a closed periphery in a plan view, i.e., in a view along a vertical direction. Each basin-shaped UBM pad 780 may have a shape of a circle, an oval, or a polygon. Non-limiting examples of shapes that may be used for the basin-shaped UBM pads 780 are illustrated in FIGS. 10A-10D. The contact area CA between each basin-shaped UBM pad 780 and a respective underlying first metal pad 658 is illustrated in a dotted shape in each of FIGS. 10A-10D.

Figure 11A:
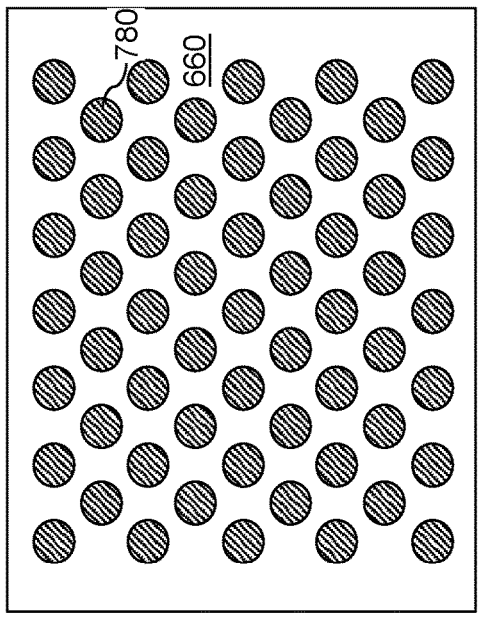
FIGS. 11A-11L illustrate various configurations for basin-shaped UBM pads formed on a semiconductor die according to various embodiments of the present disclosure.
Figure 11B:
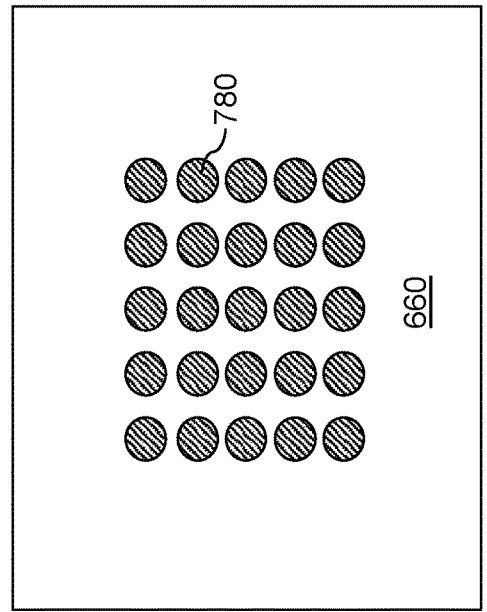
Figure 11C:
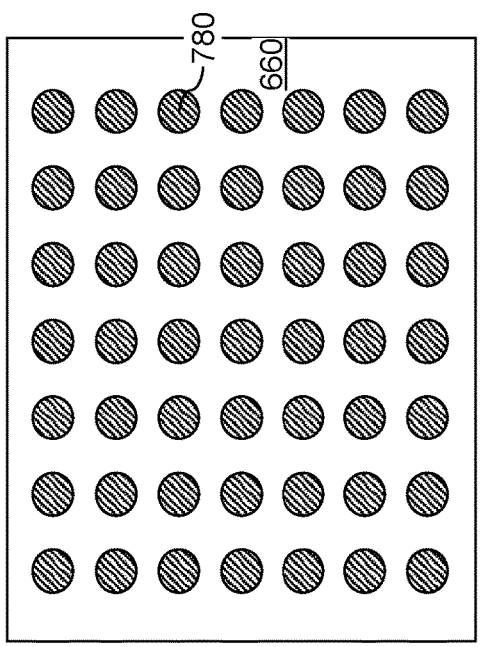
Figure 11D:
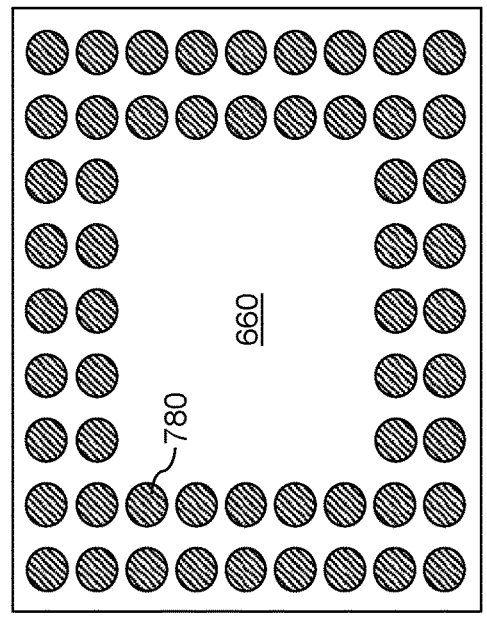

The first bonding structures (658, 780) may be arranged in any array configuration that may facilitate bonding a semiconductor die to another structure such as an interposer. FIGS. 11A-11D illustrate non-limiting examples of arrangements of first bonding structures (658, 780) over a passivation dielectric layer 660 in a respective semiconductor die. For example, the first bonding structures (658, 780) may be arranged as a two-dimensional rectangular array as illustrated in FIG. 11A, as a two-dimensional hexagonal array as illustrated in FIG. 11B, as an array formed around, and adjacent to, a periphery of a semiconductor die as illustrated in FIG. 11C, as an array formed in a center region of the semiconductor die as illustrated in FIG. 11D, or as any other type of periodic or non-periodic array.

In some embodiments, first bonding structures (658, 780), i.e., die-side bonding structures (658, 780), of different types may be formed on a same semiconductor die. In this embodiment, different types of first bonding structures (658, 780) may have different shapes and/or areas in a plan view. For example, a semiconductor die may comprise first-type bonding structures and second-type bonding structures. Each of the first-type bonding structures and the second-type bonding structures may be first bonding structures (658, 758). Thus, each of the first-type bonding structures and second-type bonding structures may a respective first metal pad 658 located within a dielectric material layer (such as a bonding-level dielectric material layer 650) and a respective basin-shaped underbump metallization (UBM) pad 780 located within a respective opening in the passivation dielectric layer 660 and contacting the respective first metal pad 658. Each basin-shaped UBM pad 780 within the first-type bonding structures has a first shape in a plan view along a vertical direction that is perpendicular to a horizontal surface of the dielectric material layer, and each basin-shaped UBM pad 780 within the second-type bonding structures has a second shape in the plan view. The second shape may be different from the first shape. Generally, each of the first shape and the second shape may be independently selected from a circle, an oval, and polygons, provided that the second shape is different from the first shape. In other words, the second shape is not congruent with the first shape. In some embodiment, the first-type bonding structures are arranged as a rectangular periodic array, and the second-type bonding structures are arranged around, and encircles, the rectangular periodic array.

Figure 11E:
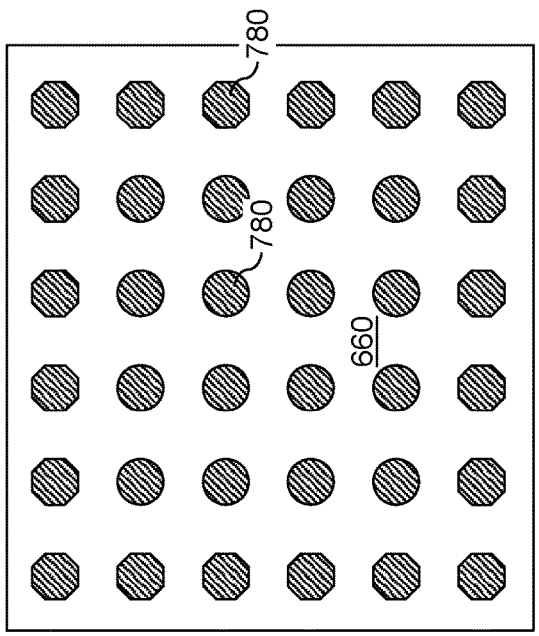
Figure 11F:
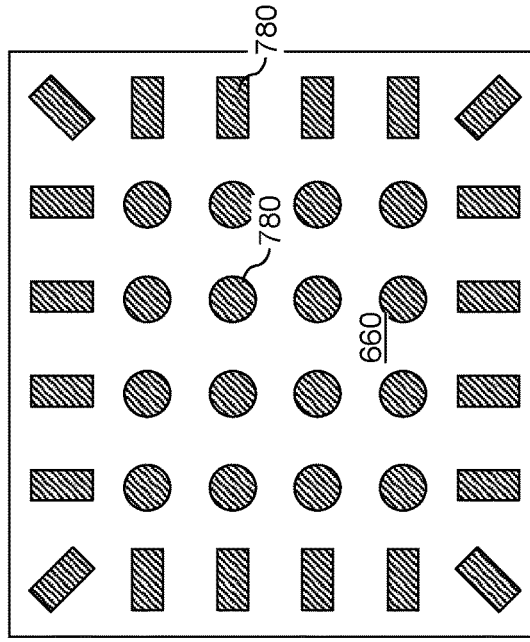
Figure 11G:
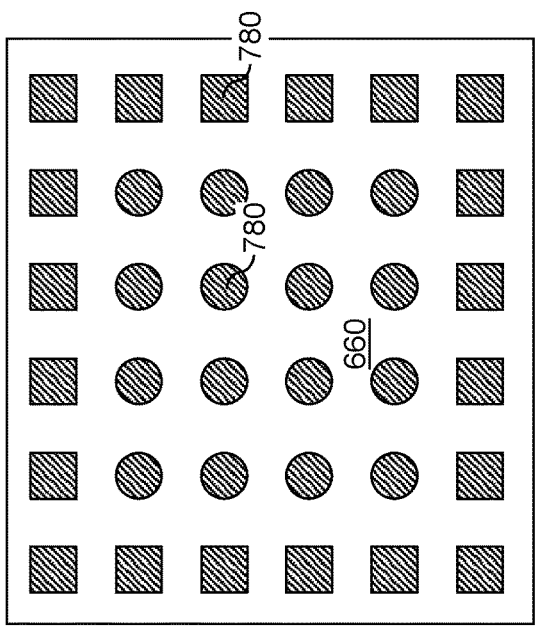
Figure 11H:
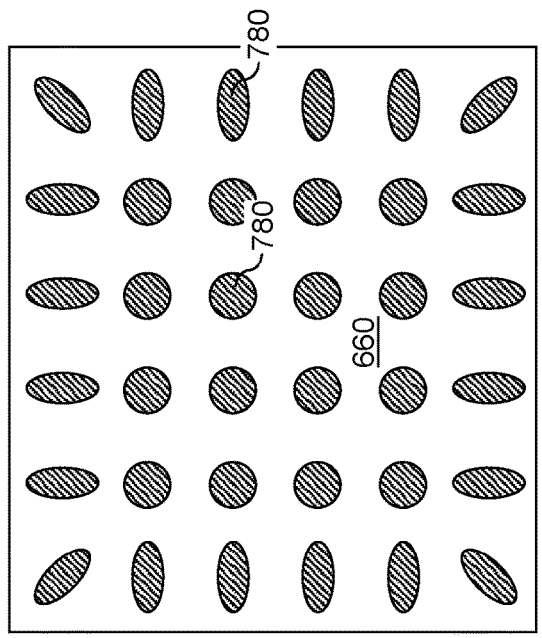
Figure 11J:
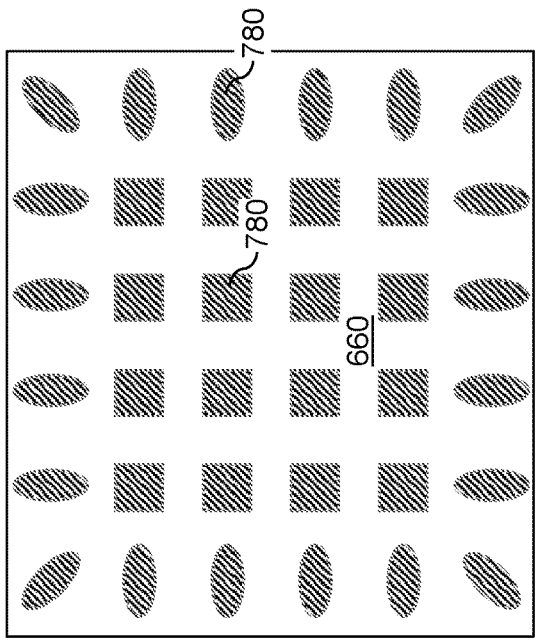
Figure 11L:
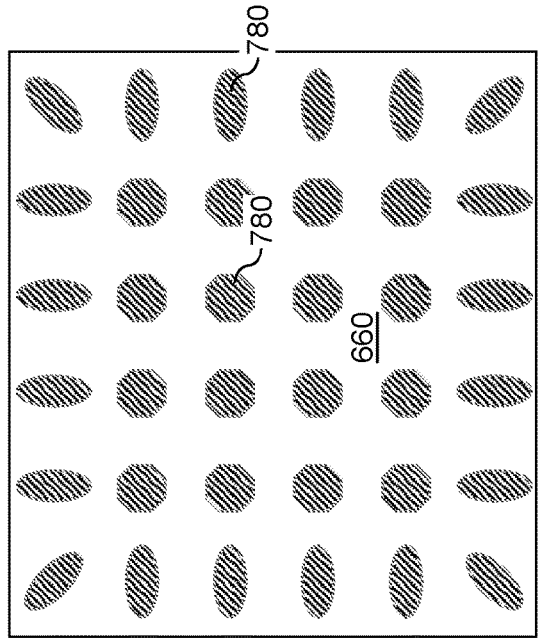
Figure 11I:
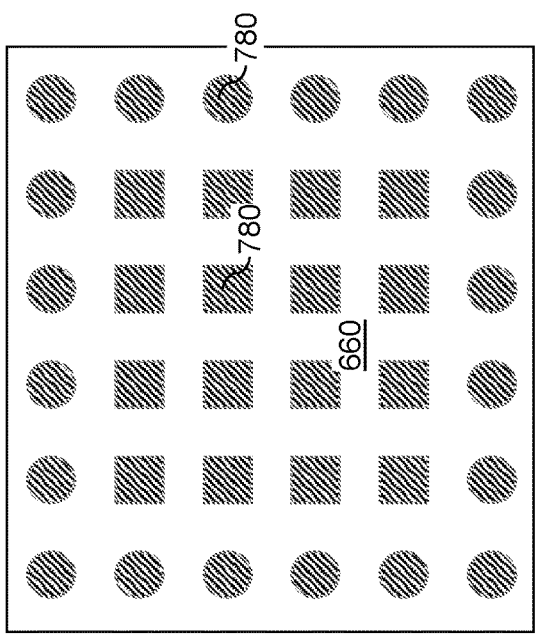
Figure 11K:
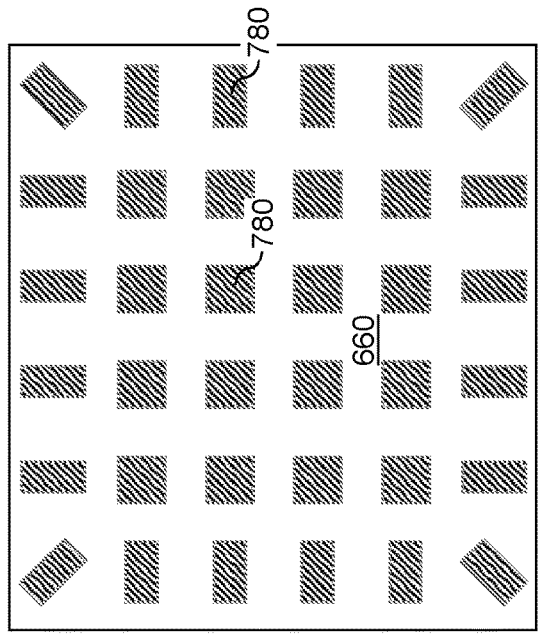

In the illustrated example of FIG. 11E, the first shape is a circle and the second shape is a rectangle. In the illustrated example of FIG. 11F, the first shape is a circle and the second shape is an octagon. In the illustrated example of FIG. 11G, the first shape is a circle and the second shape is an oval. In the illustrated example of FIG. 11H, the first shape is a circle and the second shape is a rectangle. In the illustrated example of FIG. 11I, the first shape is a rectangle and the second shape is a circle. In the illustrated example of FIG. 11J, the first shape is a rectangle and the second shape is an oval. In the illustrated example of FIG. 11K, the first shape is a rectangle and the second shape is a rectangle that is more elongated than the first shape. In the illustrated example of FIG. 11L, the first shape is an octagon and the second shape is an oval. The orientations of the first shapes and the second shapes may be the same, may be radial, or may be pseudo radial such that the second shapes located on a same edge of a semiconductor die has a same orientation. Radial arrangement of the second shapes may increase the reliability of solder bonding by more effectively absorbing radial stress generated during and/or after the bonding process that bonds each semiconductor die to an interposer.

Figure 12A:
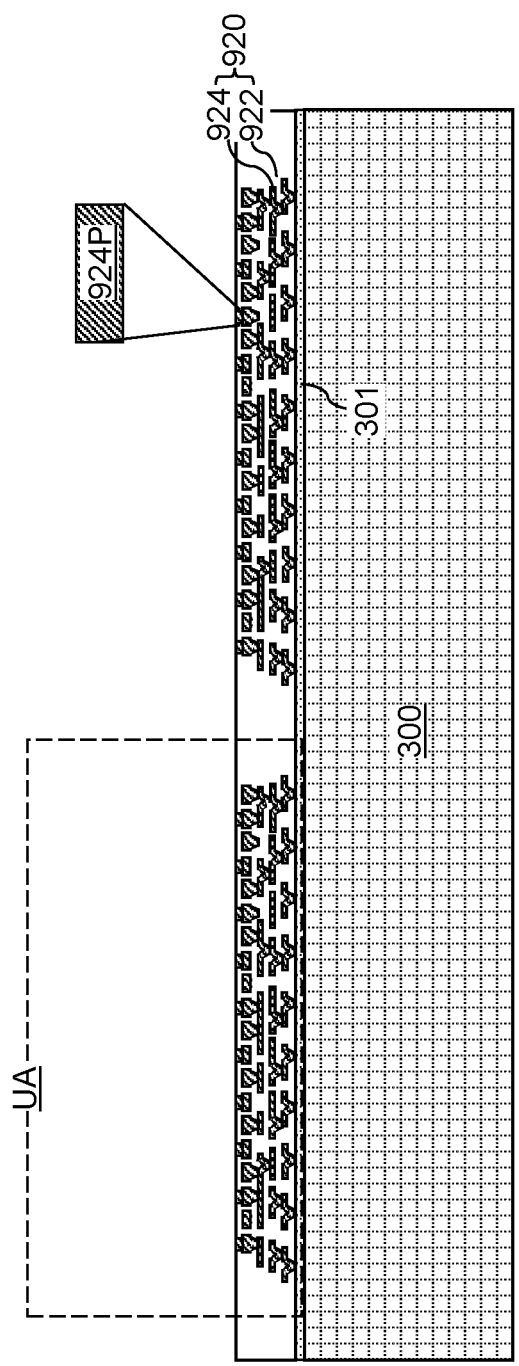
FIG. 12A is a vertical cross-sectional view of a region of an exemplary redistribution panel including redistribution structures formed on a first carrier substrate according to an embodiment of the present disclosure.
Figure 12B:
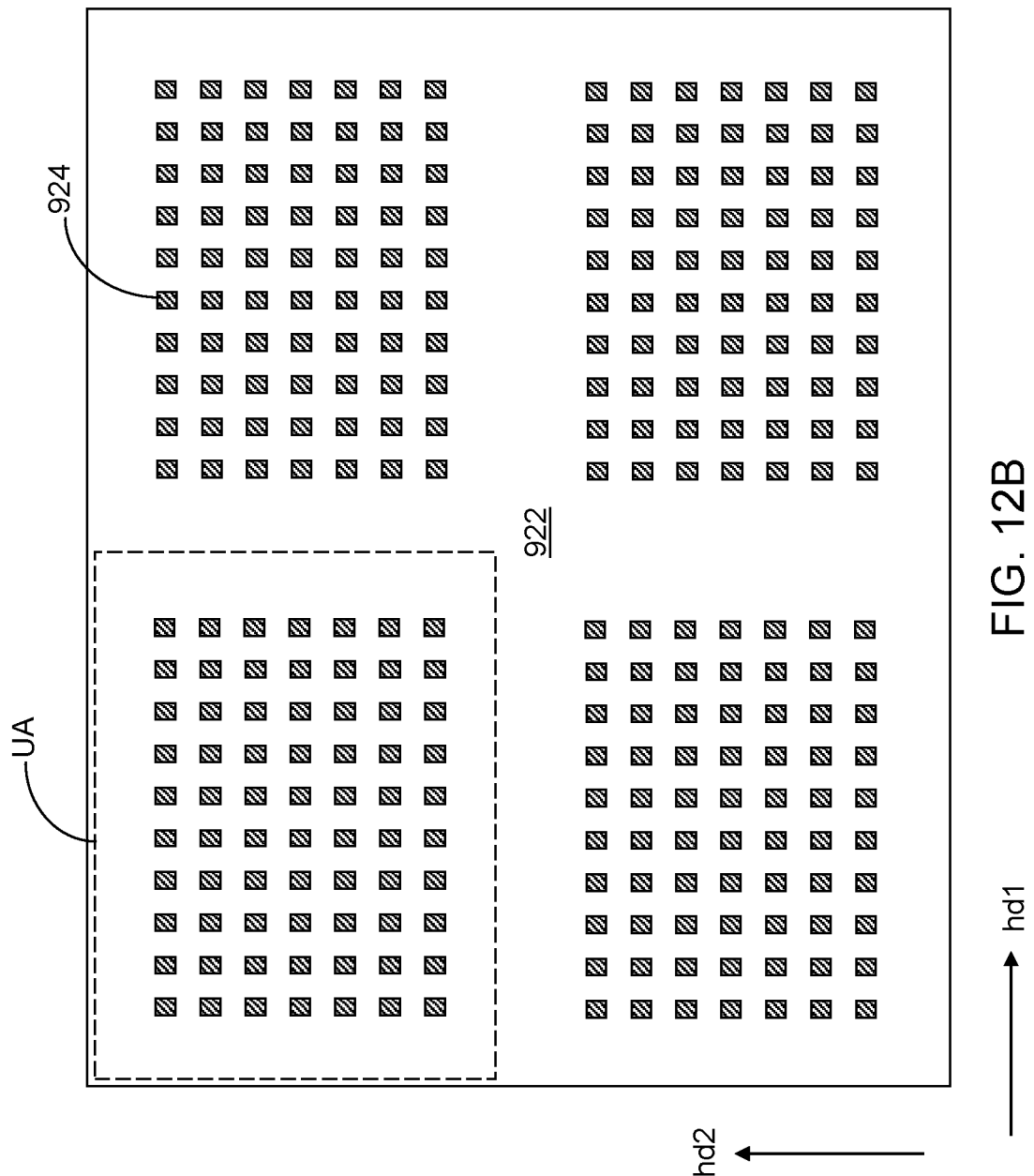
FIG. 12B is a top-down view of the exemplary redistribution panel of FIG. 12A.

Referring to FIGS. 12A and 12B, a region of an exemplary redistribution panel is illustrated, which includes interposers 920 formed on a first carrier substrate 300. The interposers 920 may be formed on a front side surface of the first carrier substrate 300. The first carrier substrate 300 may include an optically transparent substrate such as a glass substrate or a sapphire substrate. The diameter of the first carrier substrate 300 may be in a range from 150 mm to 290 mm, although lesser and greater diameters may be used. In addition, the thickness of the first carrier substrate 300 may be in a range from 500 microns to 2,000 microns, although lesser and greater thicknesses may also be used. Alternatively, the first carrier substrate 300 may be provided in a rectangular panel format. The dimensions of the first carrier in such alternative embodiments may be substantially the same.

A first adhesive layer 301 may be applied to the front-side surface of the first carrier substrate 300. In one embodiment, the first adhesive layer 301 may be a light-to-heat conversion (LTHC) layer. The LTHC layer may be a solvent-based coating applied using a spin coating method. The LTHC layer may convert ultraviolet light to heat, which may cause the material of the LTHC layer to lose adhesion. Alternatively, the first adhesive layer 301 may include a thermally decomposing adhesive material. For example, the first adhesive layer 301 may include an acrylic pressure-sensitive adhesive that decomposes at an elevated temperature. The debonding temperature of the thermally decomposing adhesive material may be in a range from 150 degrees to 200 degrees Celsius.

Redistribution structures 920 may be formed over the first adhesive layer 301. Specifically, an interposer 920 may be formed within each unit area UA, which is the area of a repetition unit that may be repeated in a two-dimensional array over the first carrier substrate 300. Each interposer 920 may include redistribution dielectric layers 922 and redistribution wiring interconnects 924. The redistribution dielectric layers 922 include a respective dielectric polymer material such as polyimide (PI), benzocyclobutene (BCB), or polybenzobisoxazole (PBO). Other suitable materials may be within the contemplated scope of disclosure. Each redistribution dielectric layer 922 may be formed by spin coating and drying of the respective dielectric polymer material. The thickness of each redistribution dielectric layer 922 may be in a range from 2 microns to 40 microns, such as from 4 microns to 20 microns. Each redistribution dielectric layer 922 may be patterned, for example, by applying and patterning a respective photoresist layer thereabove, and by transferring the pattern in the photoresist layer into the redistribution dielectric layer 922 using an etch process such as an anisotropic etch process. The photoresist layer may be subsequently removed, for example, by ashing.

Each unit area UA corresponds to an area of an interposer that is obtained upon subsequent dicing of the exemplary redistribution panel. Each of the redistribution wiring interconnects 924 may be formed by depositing a metallic seed layer by sputtering, by applying and patterning a photoresist layer over the metallic seed layer to form a pattern of openings through the photoresist layer, by electroplating a metallic fill material (such as copper, nickel, or a stack of copper and nickel), by removing the photoresist layer (for example, by ashing), and by etching portions of the metallic seed layer located between the electroplated metallic fill material portions. The metallic seed layer may include, for example, a stack of a titanium barrier layer and a copper seed layer. The titanium barrier layer may have thickness in a range from 50 nm to 400 nm, and the copper seed layer may have a thickness in a range from 100 nm to 500 nm. The metallic fill material for the redistribution wiring interconnects 924 may include copper, nickel, or copper and nickel. Other suitable metallic fill materials are within the contemplated scope of disclosure. The thickness of the metallic fill material that is deposited for each redistribution wiring interconnect 924 may be in a range from 2 microns to 40 microns, such as from 4 microns to 10 microns, although lesser or greater thicknesses may also be used. The total number of levels of wiring in each interposer 920 (i.e., the levels of the redistribution wiring interconnects 924) may be in a range from 1 to 10. A periodic two-dimensional array (such as a rectangular array) of interposers 920 may be formed over the first carrier substrate 300. Each interposer 920 may be formed within a unit area UA. The layer including all interposers 920 is herein referred to as an interposer layer. The interposer layer includes a two-dimensional array of interposers 920. In one embodiment, the two-dimensional array of interposers 920 may be a rectangular periodic two-dimensional array of interposers 920 having a first periodicity along a first horizontal direction hd1 and having a second periodicity along a second horizontal direction hd2 that is perpendicular to the first horizontal direction hd1.

According to an aspect of the present disclosure, a subset of the redistribution wiring interconnects 924 located at a topmost level of the redistribution dielectric layers 922 may comprise metal pads, which are herein referred to as second metal pads 924P. In one embodiment, the second metal pads 924P may be formed with a mirror image pattern of the pattern of the first bonding structures (658, 780) of a respective semiconductor die to be subsequently bonded to a respective interposer. In embodiments in which multiple semiconductor dies are subsequently bonded to each interposer, multiple patterns may be used for the second metal pads 924P. Each pattern may be a mirror image pattern of the first bonding structures (658, 780) of a respective semiconductor die to be subsequently bonded to the interposer.

Figure 13A:
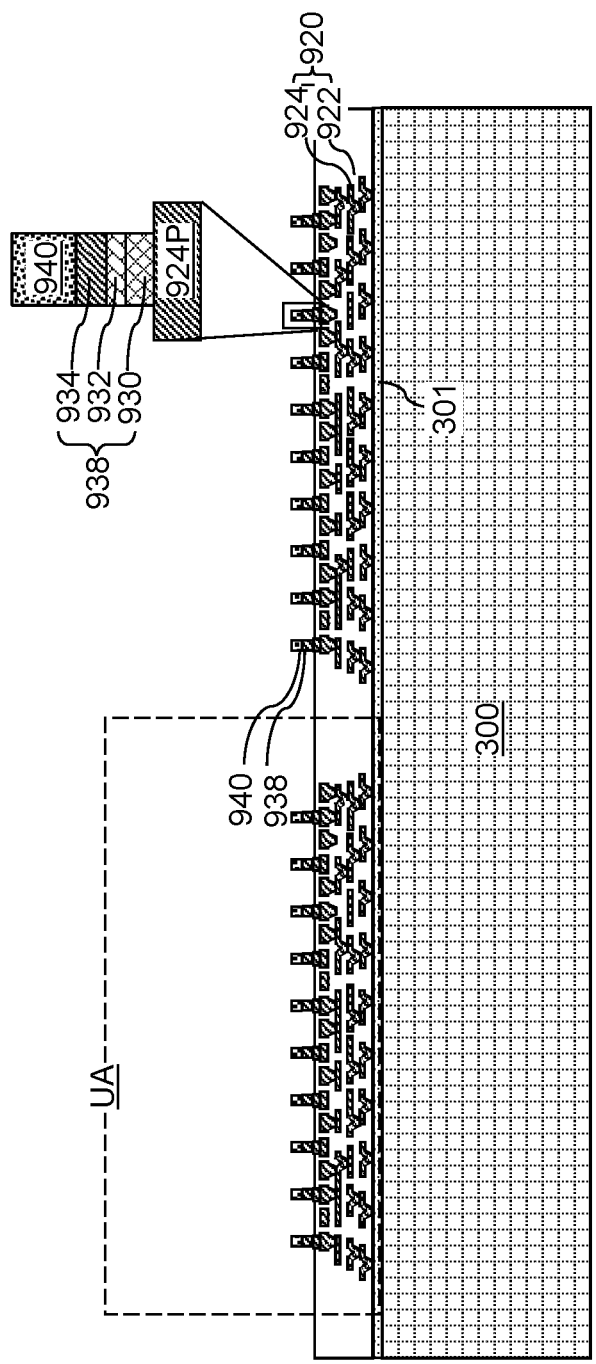
FIG. 13A is vertical cross-sectional view of a region of the exemplary redistribution panel after formation of redistribution-side bonding structures and first solder material portions according to an embodiment of the present disclosure.
Figure 13B:
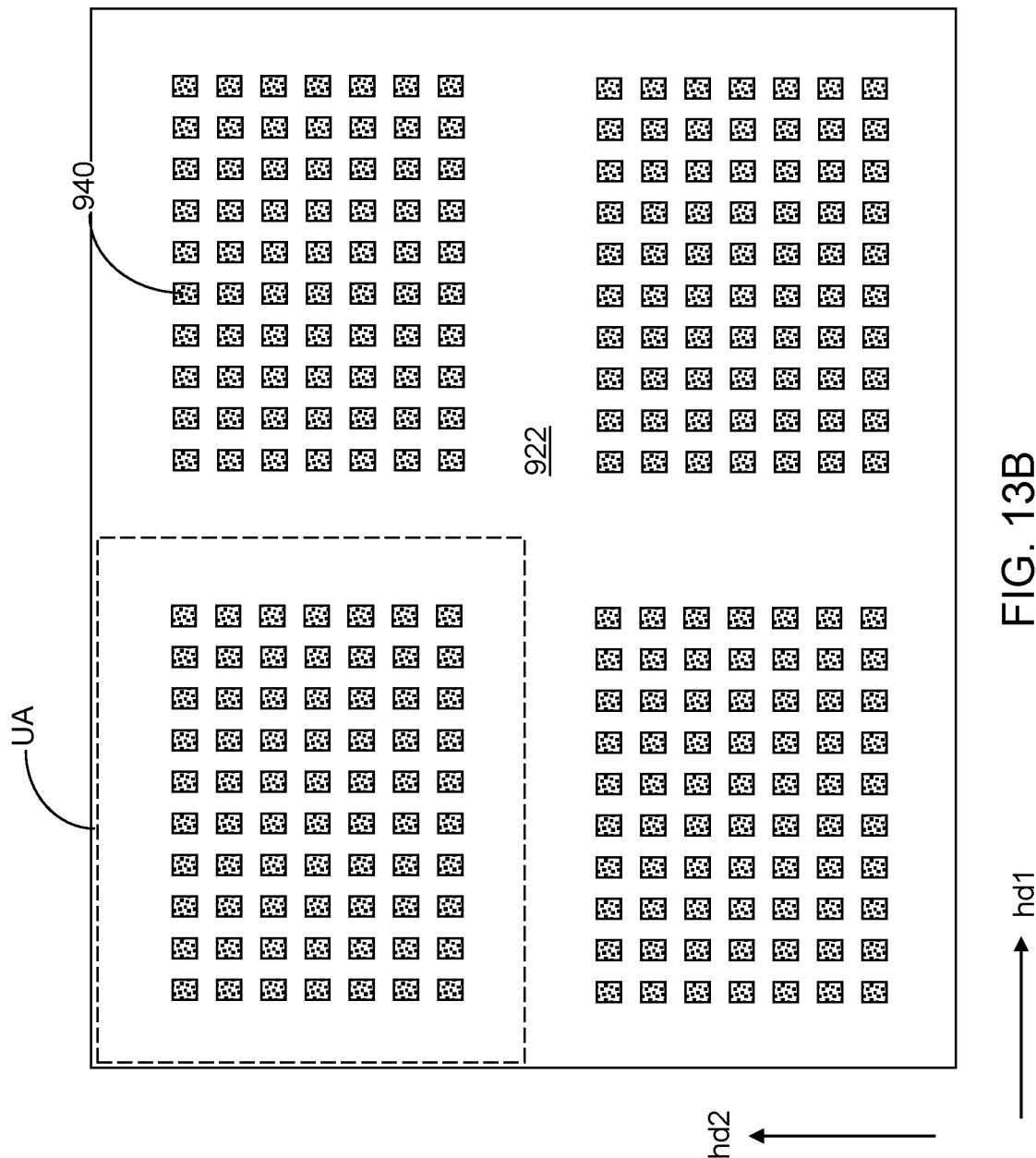
FIG. 13B is a top-down view of the region of the exemplary redistribution panel of FIG. 13A.

Referring to FIGS. 13A and 13B, at least one metallic material and a first solder material may be sequentially deposited over the front-side surface of the interposers 920. The at least one metallic material comprises a material that may be used for metallic bumps. In an illustrative example, the at least one metallic material may comprise an optional base copper layer, a non-copper metallization material layer, and a capping copper layer. The base copper layer may comprise, and/or may consist essentially of, copper, and may have a thickness in a range from 30 nm to 3,000 nm, although lesser and greater thicknesses may also be used. The non-copper metallization material layer may comprise any material that may be used for the non-copper metallization material layer 662L described with reference to FIG. 2, and may have a thickness in a range from 30 nm to 3 microns, although lesser and greater thicknesses may also be used. The capping copper layer may comprise, and/or may consist essentially of, copper, and may have a thickness in a range from 1 micron to 60 microns, such as from 5 microns to 30 microns. The first solder material may comprise a solder material suitable for C2 bonding, i.e., for microbump bonding. The thickness of the first solder material may be in a range from 2 microns to 30 microns, such as from 4 microns to 15 microns, although lesser and greater thicknesses may also be used.

The first solder material and the at least one metallic material may be patterned into discrete arrays of first solder material portions 940 and arrays of underbump metallization (UBM) pillars 938, which are also referred to as arrays of redistribution-side UBM pillars 938. Each array of UBM pillars 938 is formed within a respective unit area UA. Each array of first solder material portions 940 is formed within a respective unit area UA. Each first solder material portion 940 may have a same horizontal cross-sectional shape as an underlying UBM pillar 938.

In one embodiment, each UBM pillar 938 may include an optional base copper pillar 930, a non-copper metallization material pillar 932, and a capping copper pillar 934. Each base copper pillar 930 is a patterned portion of the base copper layer. Each non-copper metallization material pillar 932 is a patterned portion of the non-copper metallization material layer. Each capping copper pillar 934 is a patterned portion of the capping copper layer. The UBM pillars 938 may have horizontal cross-sectional shapes of rectangles, rounded rectangles, circles, regular polygons, irregular polygons, or any other two-dimensional curvilinear shape having a closed periphery. In one embodiment, UBM pillars 938 may be configured for microbump bonding (i.e., C2 bonding), and may have a height in a range from 10 microns to 30 microns, although lesser or greater thicknesses may also be used. In this embodiment, each array of UBM pillars 938 may be formed as an array of microbumps (such as copper pillars) having a lateral dimension in a range from 2 microns to 60 microns, and having a pitch in a range from 20 microns to 50 microns.

Each contiguous combination of a second metal pad 924P and a UBM pillar 938 constitutes a second bonding structure (924P, 938), which is also referred to as an interposer-side bonding structure (924, 938). Generally, an interposer 920 including second bonding structures (924P, 938) may be provided. Each of the second bonding structures (924P, 938) comprises an underbump metallization (UBM) pillar 938 having a respective cylindrical shape. In one embodiment, each of the UBM pillars 938 comprises a vertical stack of a non-copper metallization material pillar 932 and a capping copper pillar 934. In one embodiment, the UBM pillar 938 within each of the second bonding structures (924P, 938) has a uniform horizontal cross-sectional view that is invariant with a translation along a vertical direction. In one embodiment, each of the second bonding structures (924P, 938) comprises a second metal pad 924P, and each of the UBM pillars 938 is located on a respective one of the second metal pads 924P.

Figure 14A:
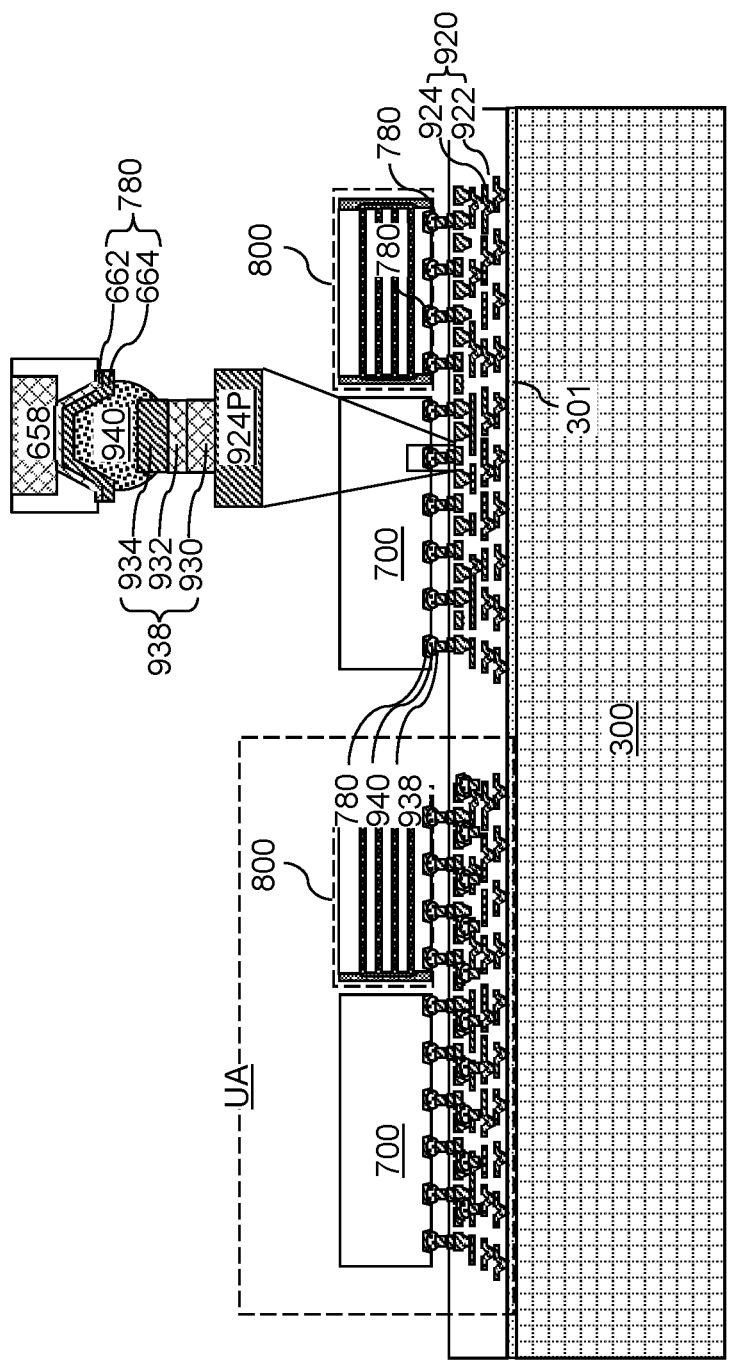
FIG. 14A is a vertical cross-sectional view of a region an exemplary structure after attaching semiconductor dies to the exemplary redistribution panel according to an embodiment of the present disclosure.
Figure 14B:
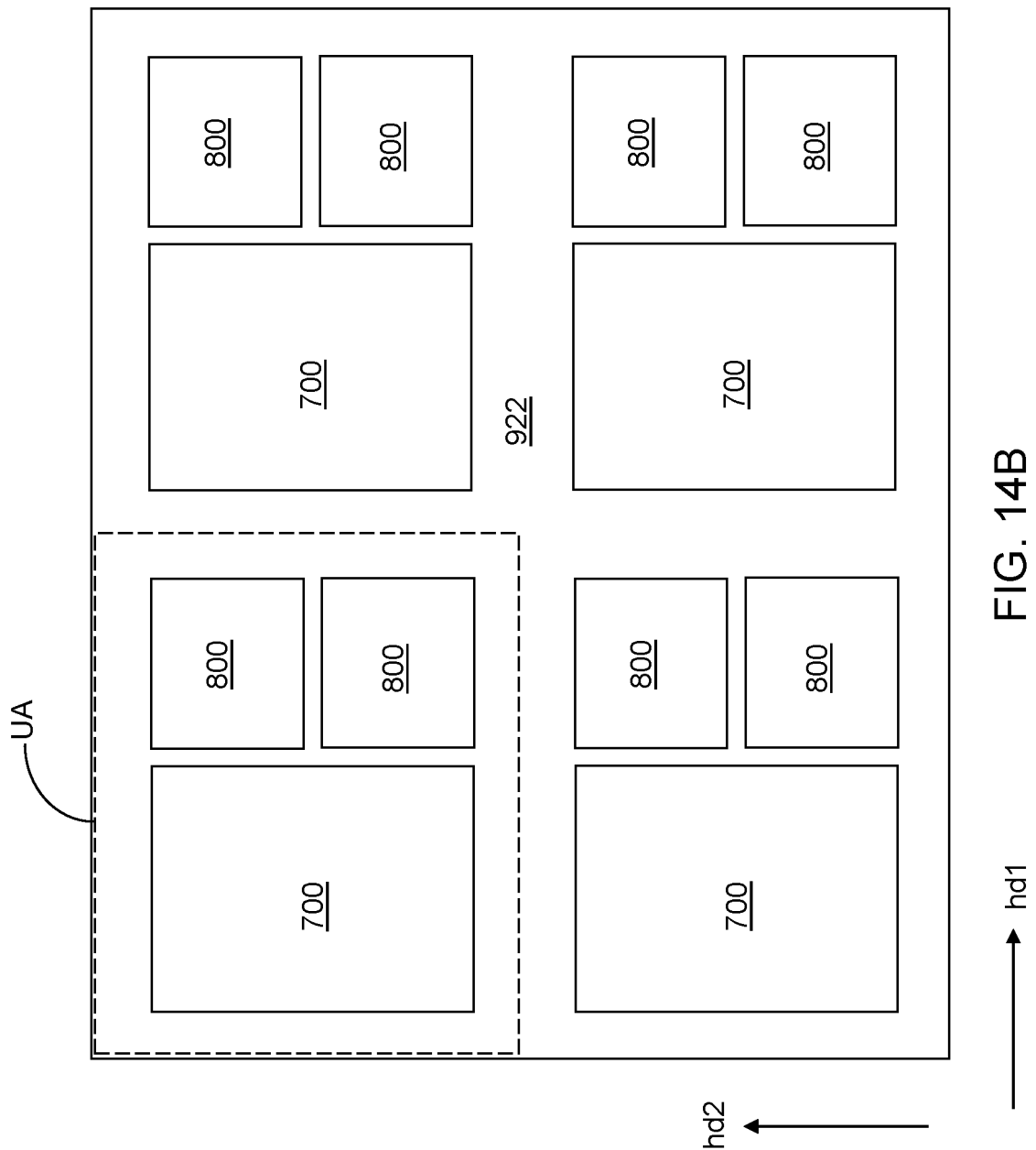
FIG. 14B is a top-down view of the region of the exemplary structure of FIG. 14A.
Figure 14C:
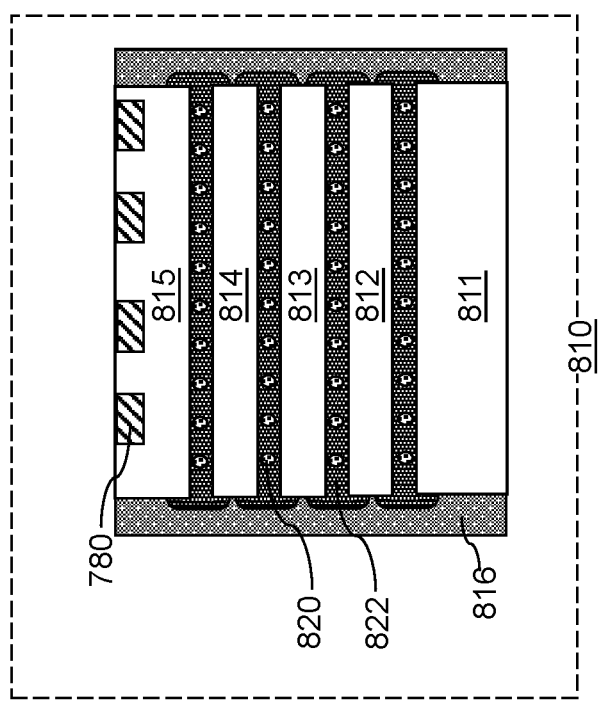
FIG. 14C is a magnified vertical cross-sectional view of a high bandwidth memory die.
Figure 14D:
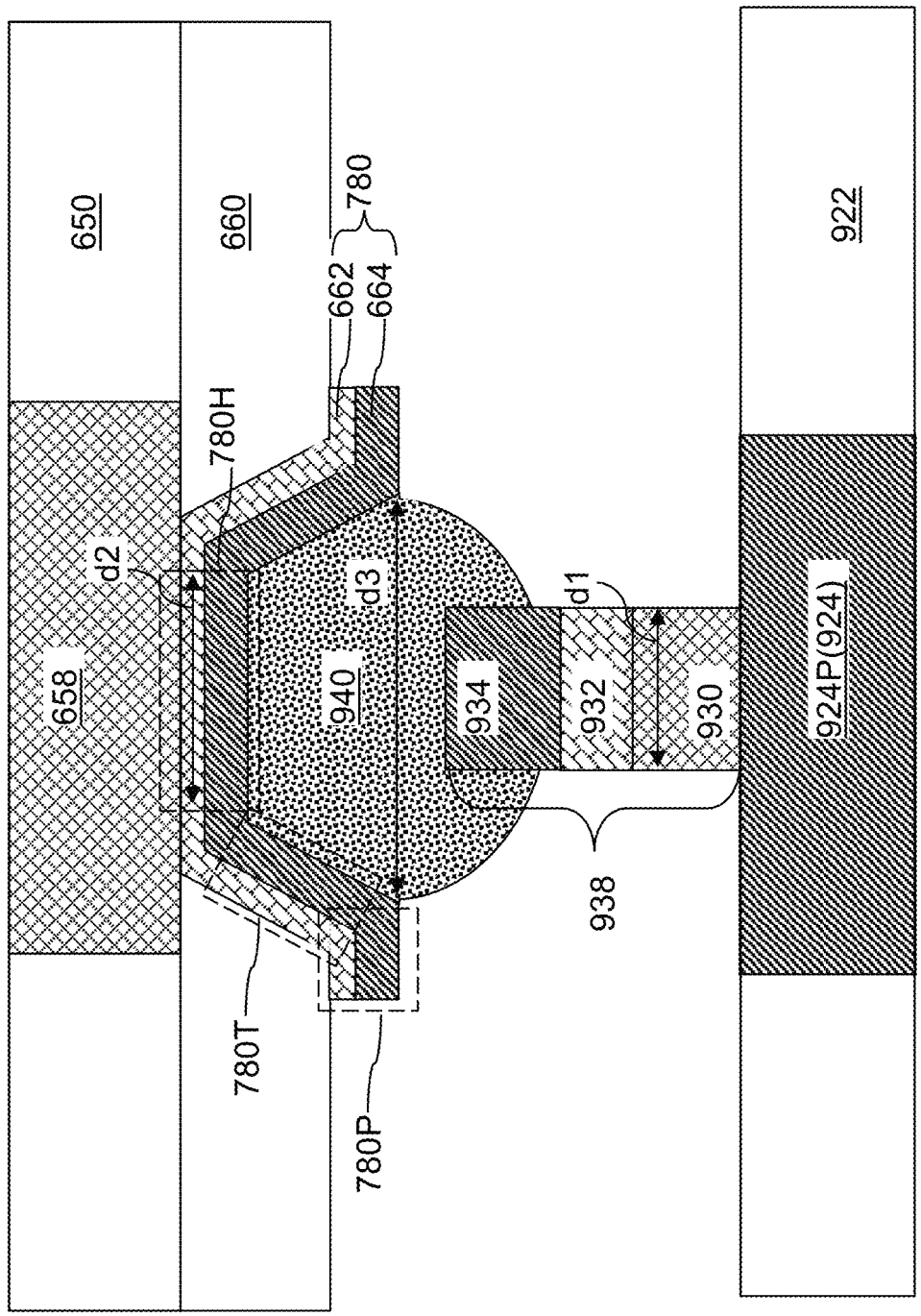
FIG. 14D is a magnified view of a region within the vertical cross-sectional view of FIG. 14A.

Referring to FIGS. 14A-14E, a set of at least one semiconductor die (700, 800) may be bonded to each interposer 920. FIG. 14D corresponds to an embodiment in which the structure illustrated in FIG. 6 is used in a semiconductor die (700 or 800), and FIG. 14E corresponds to an embodiment in which the structure illustrated in FIG. 9 is used in a semiconductor die (700 or 800). In one embodiment, the interposers 920 may be arranged as a two-dimensional periodic array, and multiple sets of at least one semiconductor die (700, 800) may be bonded to the interposers 920 as a two-dimensional periodic rectangular array of sets of the at least one semiconductor die (700, 800). Each set of at least one semiconductor die (700, 800) includes at least one semiconductor die. Each set of at least one semiconductor die (700, 800) may include any set of at least one semiconductor die known in the art. In one embodiment, each set of at least one semiconductor die (700, 800) may comprise a plurality of semiconductor dies (700, 800). For example, each set of at least one semiconductor die (700, 800) may include at least one system-on-chip (SoC) die 700 and/or at least one memory die 800. Each SoC die 700 may comprise an application processor die, a central processing unit die, or a graphic processing unit die. In one embodiment, the at least one memory die 800 may comprise a high bandwidth memory (HBM) die that includes a vertical stack of static random access memory dies. In one embodiment, the at least one semiconductor die (700, 800) may include at least one system-on-chip (SoC) die and a high bandwidth memory (HBM) die including a vertical stack of static random access memory (SRAM) dies that are interconnected to one another through microbumps and are laterally surrounded by an epoxy molding material enclosure frame.

Each semiconductor die (700, 800) may comprise a respective array of first bonding structures (658, 780). For example, each SoC die 700 may comprise an array of SoC metal bonding structures that is one type of first bonding structures (658, 780), and each memory die 800 may comprise an array of memory-die metal bonding structures that is another type of first bonding structures (658, 780). Each of the semiconductor dies (700, 800) may be positioned in a face-down position such that first bonding structures (658, 780) face the first solder material portions 940. Each set of at least one semiconductor die (700, 800) may be placed within a respective unit area UA. Placement of the semiconductor dies (700, 800) may be performed using a pick and place apparatus such that each of the first bonding structures (658, 780) may be placed on a top surface of a respective one of the first solder material portions 940.

Generally, a interposer 920 including UBM pillars 938 thereupon may be provided, and at least one semiconductor die (700, 800) including a respective set of first bonding structures (658, 780) may be provided. The at least one semiconductor die (700, 800) may be bonded to the interposer 920 using first solder material portions 940 that are bonded to a respective UBM pillar 938 and to a respective one of the first bonding structures (658, 780). Each set of at least one semiconductor die (700, 800) may be attached to a respective interposer 920 through a respective set of first solder material portions 940.

In embodiments in which a high bandwidth memory (HBM) die 810 is used as a memory die 800, the HBM die 810 may include a vertical stack of static random access memory dies (811, 812, 813, 814, 815) that are interconnected to one another through microbumps 820 and are laterally surrounded by an epoxy molding material enclosure frame 816. The gaps between vertically neighboring pairs of the random access memory dies (811, 812, 813, 814, 815) may be filled with a HBM underfill material portions 822 that laterally surrounds a respective set of microbumps 820. The HBM die 810 may comprise an array of memory-die metal bonding structures (which are first bonding structures (658, 780)) configured to be bonded to a subset of an array of UBM pillars 938 within a unit area UA. The HBM die 810 may, or may not, be configured to provide a high bandwidth as defined under JEDEC standards, i.e., standards defined by The JEDEC Solid State Technology Association.

Generally, the second bonding structures (924P, 938) may be bonded to the first bonding structures (658, 780) through an array of solder material portions 940. In one embodiment, each of the UBM pillars 938 comprises a vertical stack of a non-copper metallization material pillar 932 and a capping copper pillar 934. In embodiments in which the first bonding structures (658, 780) comprise multiple types of first bonding structures (658, 780) such a first-type bonding structures and second-type bonding structures having different shapes, an array of solder material portions 940 may be bonded to a respective one of the first-type bonding structures and to a respective one of the second-type bonding structures.

In one embodiment, each of the second bonding structures (924P, 938) comprises a second metal pad 924P laterally surrounded by a dielectric material layer (such as a topmost redistribution dielectric layer 922). In one embodiment, the UBM pillar 938 within each of the second bonding structures (924P, 938) comprises a stack of a capping copper pedestal 934 and a non-copper metallization material pedestal 932 that have a same horizontal cross-sectional area. In one embodiment, the UBM pillar 938 within each of the second bonding structures (924P, 938) comprises a base copper pedestal 930 disposed between the non-copper metallization material pedestal 932 and a respective one of the second metal pads 924P.

In one embodiment, basin-shaped UBM pad 780 within each of the first bonding structures (658, 780) comprises a horizontally-extending portion 780H having a uniform thickness and contacting a respective one of the first metal pads 658, a taper-containing portion 780T adjoined to a periphery of the horizontally-extending portion 780H and contacting at least one tapered surface segment of the passivation dielectric layer 660 that is a respective tapered portion of the contoured surface of the passivation dielectric layer 660, and a peripheral plate portion 780P adjoined to an outer periphery of the taper-containing portion 780T and contacting an annular segment of a horizontally-extending portion of the contoured surface of the passivation dielectric layer 660.

In one embodiment, the UBM pillar 938 within each of the second bonding structures (924P, 938) may have a maximum lateral extent (such as a diameter) of a first dimension d1, and the horizontally-extending portion 780H of the basin-shaped UBM pad 780 within each of the first bonding structures (658, 780) has a maximum lateral extent (such as a diameter, a diagonal, or a major axis) of a second dimension d2. According to an embodiment, a ratio of the second dimension d2 to the first dimension d1 may be in a range from 1.0 to 2.0, such as from 1.1 to 1.8, and/or from 1.2 to 1.6. Generally, a configuration in which the second direction d2 may be greater than the first dimension d1 allows lateral confinement of each UBM pillar 938 within the area of a solder material portion 940 that is confined primarily within the area of a concave volume defined by the recessed and tapered surfaces of a respective basin-shaped UBM pad 780 in some embodiments.

An inner periphery of the peripheral plate portion 780P of the basin-shaped UBM pad 780 may be adjoined to a periphery of the taper-containing portion 780T of the basin-shaped UBM pad 780, and has a maximum lateral extent of a third dimension d3. In one embodiment, the ratio of the third dimension d3 to the second dimension d2 is in a range from 1.1 to 2.0, such as from 1.2 to 1.8, and/or from 1.3 to 1.6. Generally, a ratio of the third dimension d3 to the second dimension d2 that is less than 2.0 facilitates formation of the basin-shaped UBM pad 780 as a high-density array.

In one embodiment, a straight tapered surface extends from the periphery of the horizontally-extending portion 780H of the basin-shaped UBM pad 780 to the inner periphery of the peripheral plate portion 780P of the basin-shaped UBM pad 780 as illustrated in FIG. 14D.

Figure 14E:
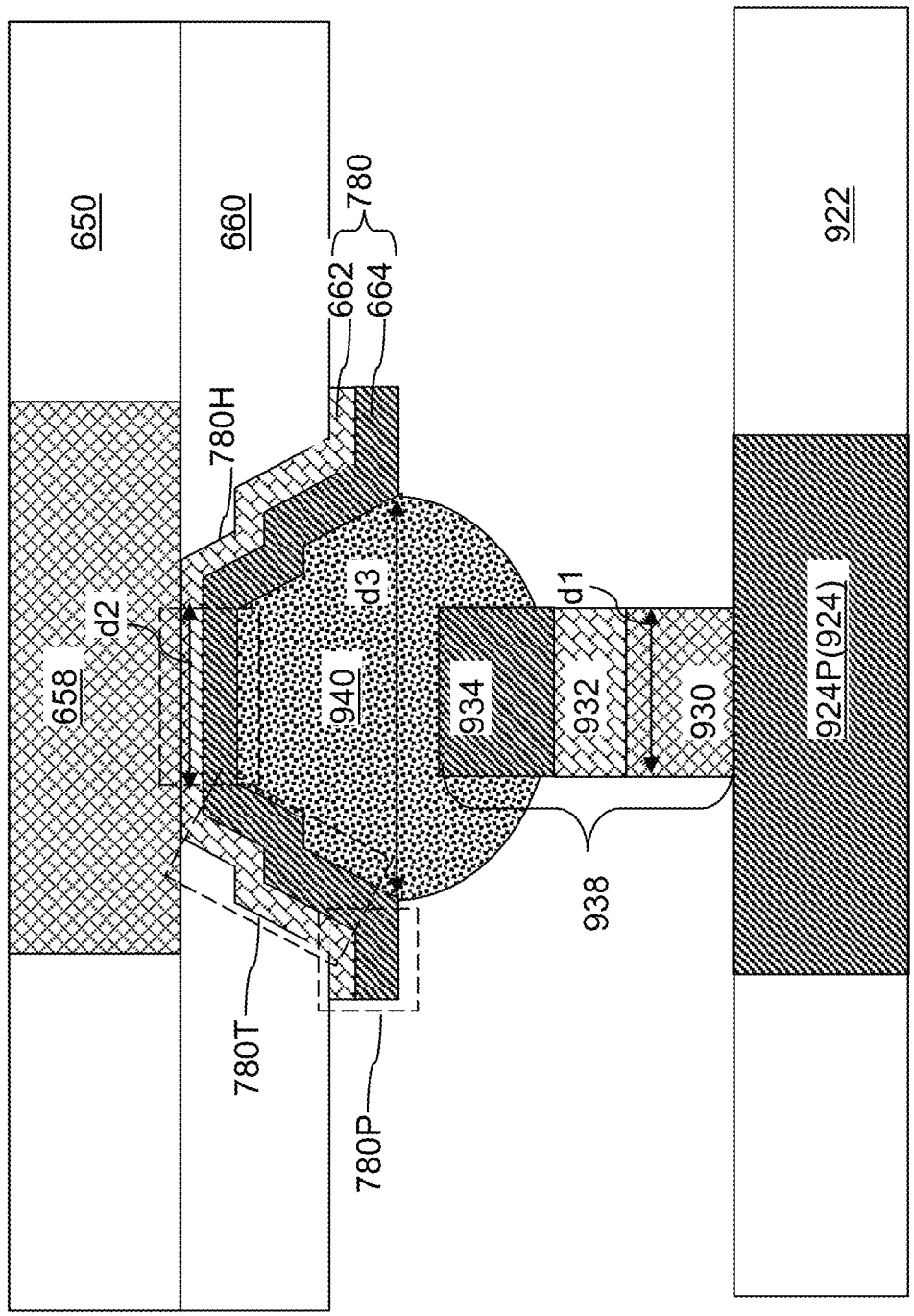
FIG. 14E is a magnified view of a region within an alternative embodiment of the exemplary structure illustrated in FIGS. 14A-14D.

In one embodiment, a stepped surface extends from the periphery of the horizontally-extending portion 780H of the basin-shaped UBM pad 780 to the inner periphery of the peripheral plate portion 780P of the basin-shaped UBM pad 780, and the stepped surface comprises two tapered annular surfaces adjoined to each other through a horizontal annular surface as illustrated in FIG. 14E.

Figure 15:
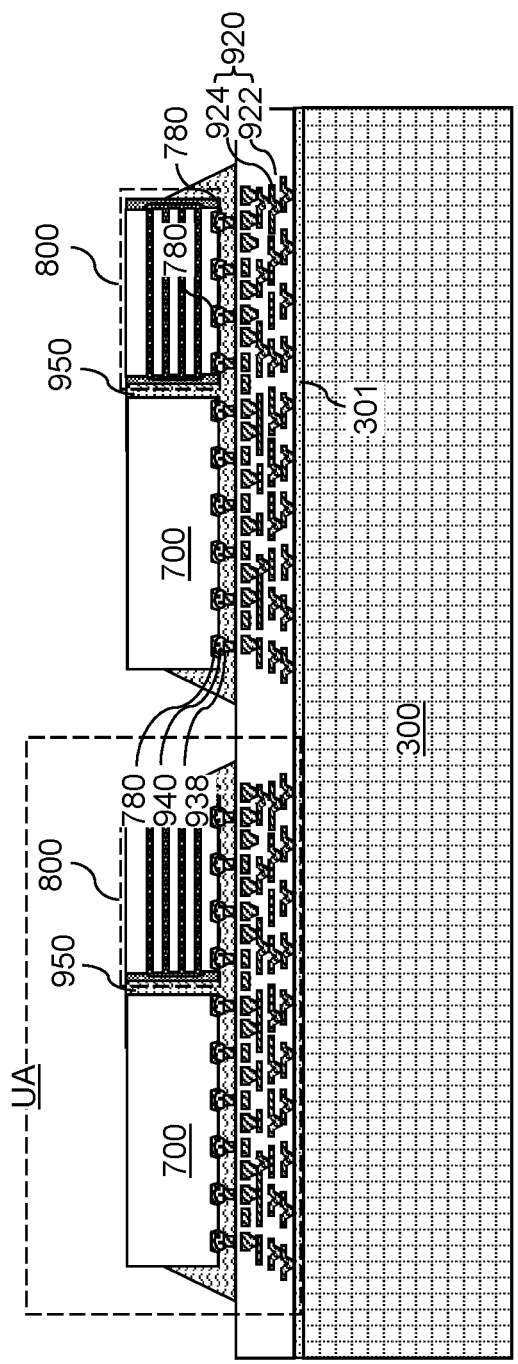
FIG. 15 is a vertical cross-sectional view of a region of the exemplary structure after formation of first underfill material portions.

Referring to FIG. 15, a first underfill material may be applied into each gap between the interposers 920 and sets of at least one semiconductor die (700, 800) that are bonded to the interposers 920. The first underfill material may comprise any underfill material known in the art. A first underfill material portion 950 may be formed within each unit area UA between an interposer 920 and an overlying set of at least one semiconductor die (700, 800). The first underfill material portions 950 may be formed by injecting the first underfill material around a respective array of first solder material portions 940 in a respective unit area UA. Any known underfill material application method may be used, which may be, for example, the capillary underfill method, the molded underfill method, or the printed underfill method.

Within each unit area UA, a first underfill material portion 950 may laterally surround, and contact, each of the first solder material portions 940 within the unit area UA. The first underfill material portion 950 may be formed around, and contact, the first solder material portions 940, the UBM pillars 938, and the first bonding structures (658, 780) in the unit area UA.

Each interposer 920 in a unit area UA comprises UBM pillars 938. At least one semiconductor die (700, 800) comprising a respective set of first bonding structures (658, 780) is attached to the UBM pillars 938 through a respective set of first solder material portions 940 within each unit area UA. Within each unit area UA, a first underfill material portion 950 laterally surrounds the UBM pillars 938 and the first bonding structures (658, 780) of the at least one semiconductor die (700, 800).

Figure 16A:
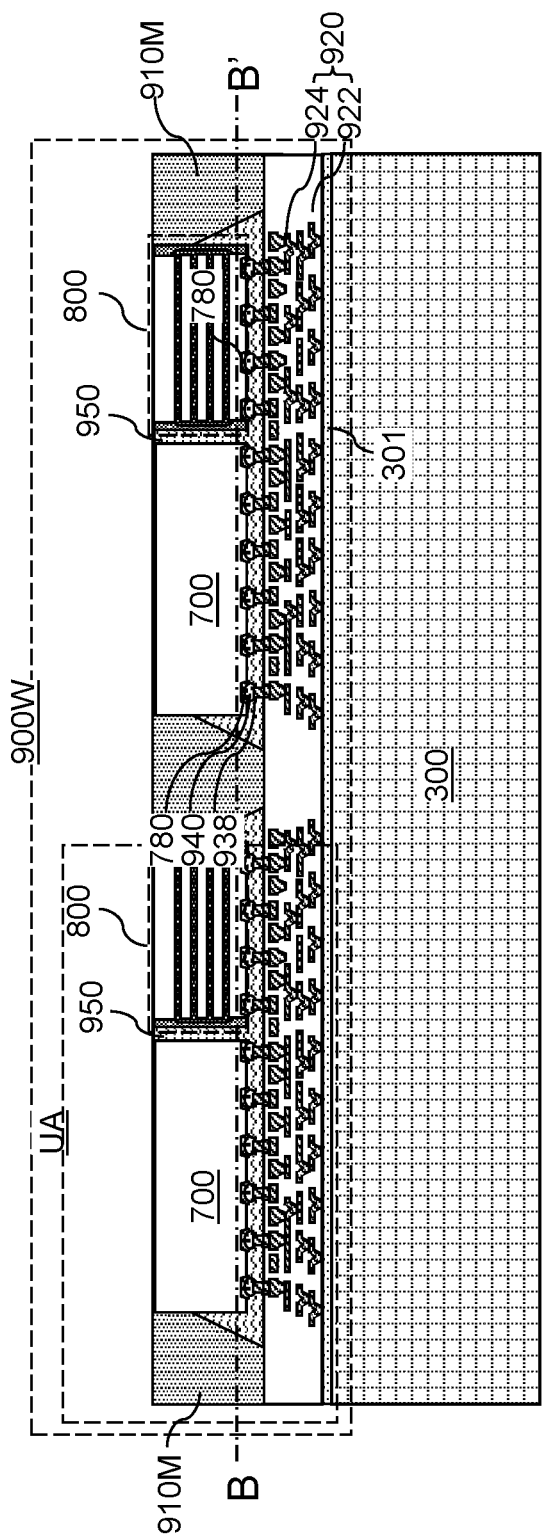
FIG. 16A is a vertical cross-sectional view of a region of the exemplary structure after formation of an epoxy molding compound (EMC) matrix according to an embodiment of the present disclosure.
Figure 16B:
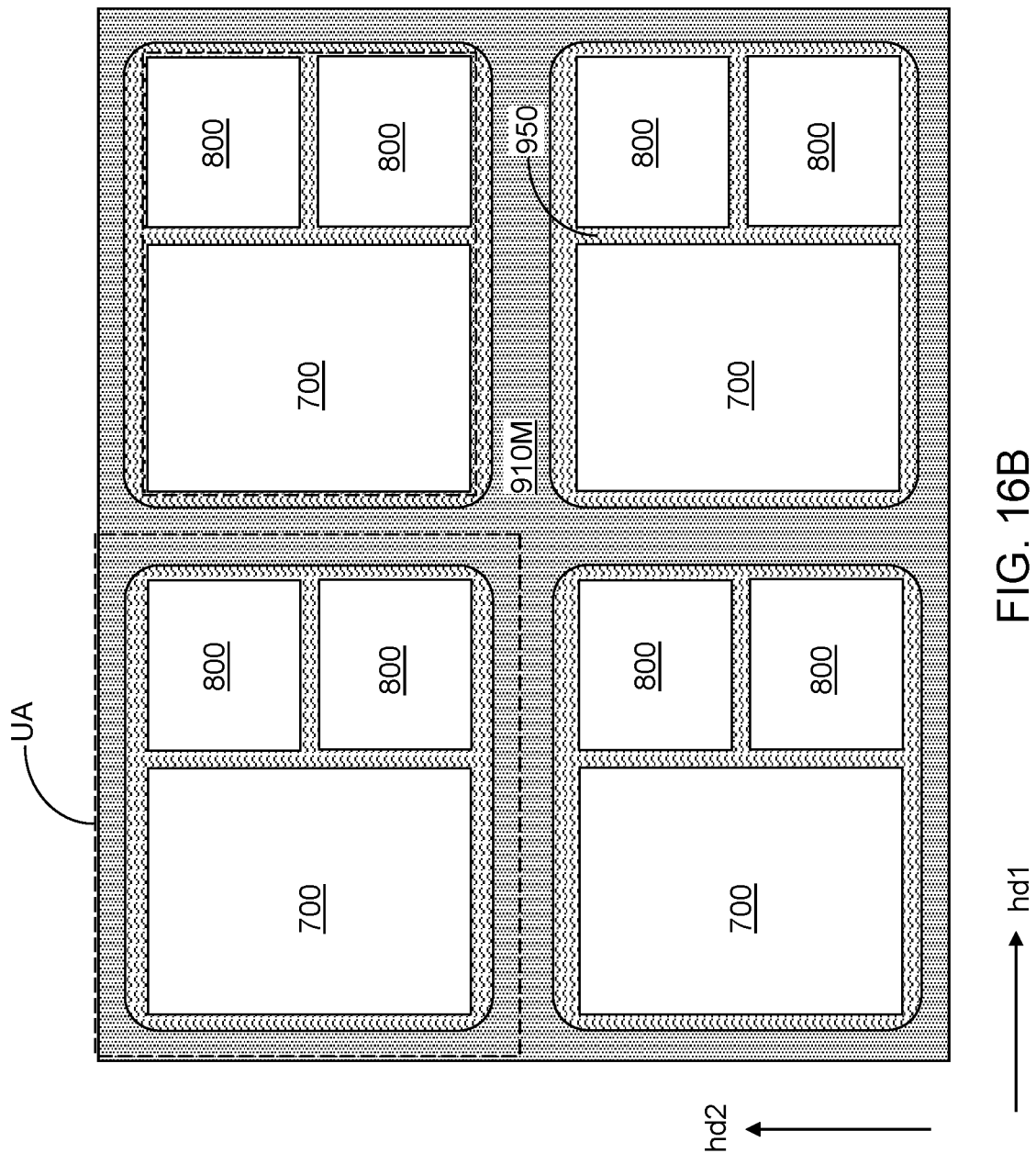
FIG. 16B is a top-down view of the region of the exemplary structure of FIG. 16A.

Referring to FIGS. 16A and 16B, an epoxy molding compound (EMC) may be applied to the gaps between contiguous assemblies of a respective set of semiconductor dies (700, 800) and a first underfill material portion 950.

The EMC may include an epoxy-containing compound that may be hardened (i.e., cured) to provide a dielectric material portion having sufficient stiffness and mechanical strength. The EMC may include epoxy resin, hardener, silica (as a filler material), and other additives. The EMC may be provided in a liquid form or in a solid form depending on the viscosity and flowability. Liquid EMC provides better handling, good flowability, fewer voids, better fill, and less flow marks. Solid EMC provides less cure shrinkage, better stand-off, and less die drift. A high filler content (such as 85% in weight) within an EMC may decrease the time in mold, lower the mold shrinkage, and reduce the mold warpage. Uniform filler size distribution in the EMC may reduce flow marks, and may enhance flowability. The curing temperature of the EMC may be lower than the release (debonding) temperature of the first adhesive layer 301 in embodiments in which the adhesive layer includes a thermally debonding material. For example, the curing temperature of the EMC may be in a range from 125° C. to 150° C.

The EMC may be cured at a curing temperature to form an EMC matrix 910M that laterally surrounds and embeds each assembly of a set of semiconductor dies (700, 800) and a first underfill material portion 950. The EMC matrix 910M includes a plurality of epoxy molding compound (EMC) die frames that may be laterally adjoined to one another. Each EMC die frame is a portion of the EMC matrix 910M that is located within a respective unit area UA. Thus, each EMC die frame laterally surrounds and embeds a respective a set of semiconductor dies (700, 800) and a respective first underfill material portion 950. Young's modulus of pure epoxy is about 3.35 GPa, and Young's modulus of the EMC may be higher than Young's modulus of pure epoxy by adding additives. Young's modulus of EMC may be greater than 3.5 GPa.

Portions of the EMC matrix 910M that overlies the horizontal plane including the top surfaces of the semiconductor dies (700, 800) may be removed by a planarization process. For example, the portions of the EMC matrix 910M that overlies the horizontal plane may be removed using a chemical mechanical planarization (CMP). In some embodiments, the top surface of an SoC die 700 may be higher than the top surface of a memory die 800. In such embodiments, an upper portion of each SoC 700 and the material of the EMC matrix 910M may be polished together during a chemical mechanical polishing (CMP) process to provide flat top surfaces for all of the semiconductor dies (700, 800) within the horizontal plane including the horizontal top surface of the EMC matrix 910M. The combination of the remaining portion of the EMC matrix 910M, the semiconductor dies (700, 800), the first underfill material portions 950, and the two-dimensional array of interposers 920 comprises a reconstituted wafer 900W. Each portion of the EMC matrix 910M located within a unit area UA constitutes an EMC die frame.

Figure 17:
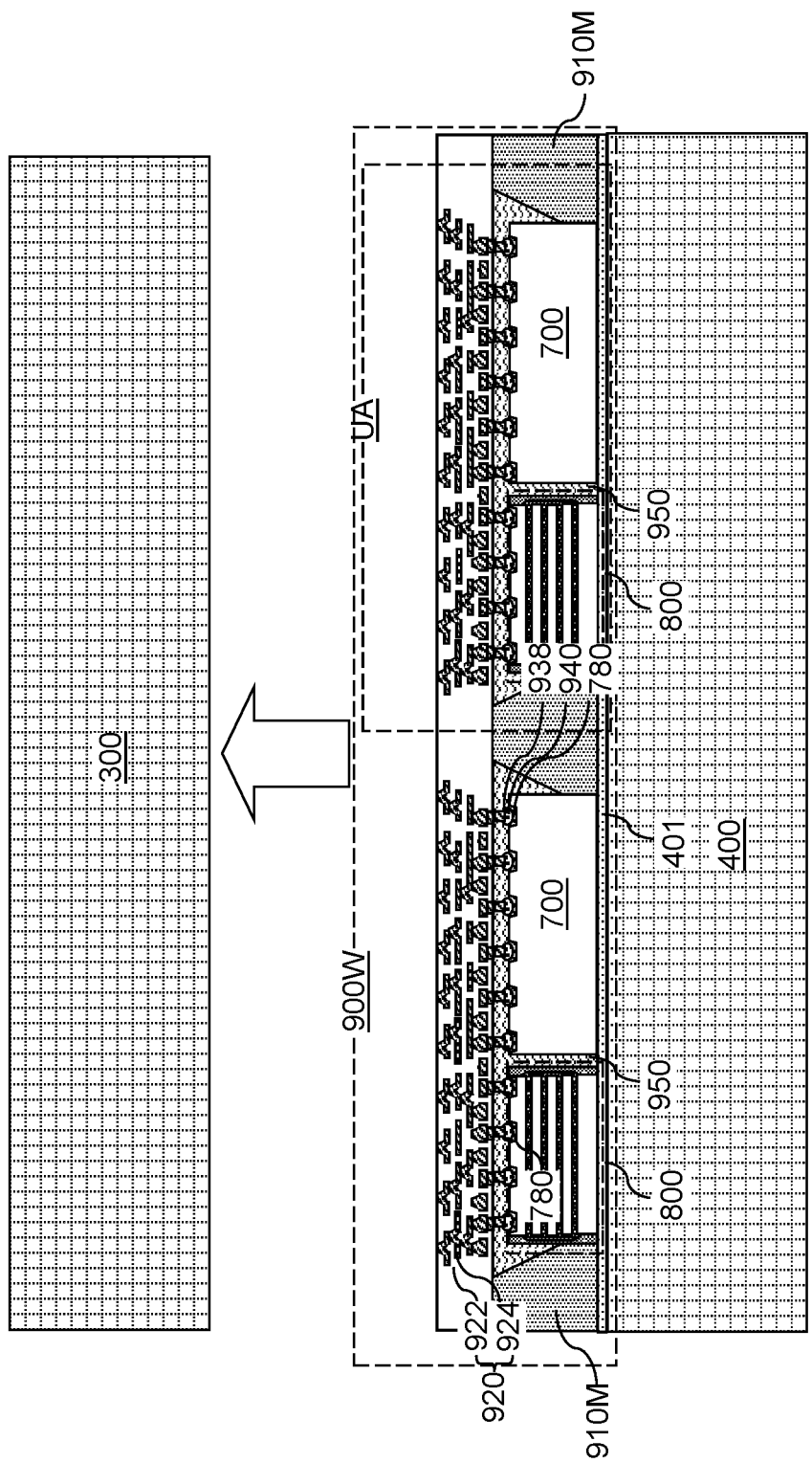
FIG. 17 is a vertical cross-sectional view of a region of the exemplary structure after attaching a second carrier substrate and detaching the first carrier substrate according to an embodiment of the present disclosure.

Referring to FIG. 17, a second adhesive layer 401 may be applied to the physically exposed planar surface of the reconstituted wafer 900W, i.e., the physically exposed surfaces of the EMC matrix 910M, the semiconductor dies (700, 800), and the first underfill material portions 950. In one embodiment, the second adhesive layer 401 may comprise a same material as, or may comprise a different material from, the material of the first adhesive layer 301. In embodiments in which the first adhesive layer 301 comprises a thermally decomposing adhesive material, the second adhesive layer 401 may comprise another thermally decomposing adhesive material that decomposes at a higher temperature, or may comprise a light-to-heat conversion material.

A second carrier substrate 400 may be attached to the second adhesive layer 401. The second carrier substrate 400 may be attached to the opposite side of the reconstituted wafer 900W relative to the first carrier substrate 300. Generally, the second carrier substrate 400 may comprise any material that may be used for the first carrier substrate 300. The thickness of the second carrier substrate 400 may be in a range from 500 microns to 2,000 microns, although lesser and greater thicknesses may also be used.

The first adhesive layer 301 may be decomposed by ultraviolet radiation or by a thermal anneal at a debonding temperature. In embodiments in which the first carrier substrate 300 includes an optically transparent material and the first adhesive layer 301 includes an LTHC layer, the first adhesive layer 301 may be decomposed by irradiating ultraviolet light through the transparent carrier substrate. The LTHC layer may be absorb the ultraviolet radiation and generate heat, which decomposes the material of the LTHC layer and cause the transparent first carrier substrate 300 to be detached from the reconstituted wafer 900W. In embodiments in which the first adhesive layer 301 includes a thermally decomposing adhesive material, a thermal anneal process at a debonding temperature may be performed to detach the first carrier substrate 300 from the reconstituted wafer 900W.

Figure 18:
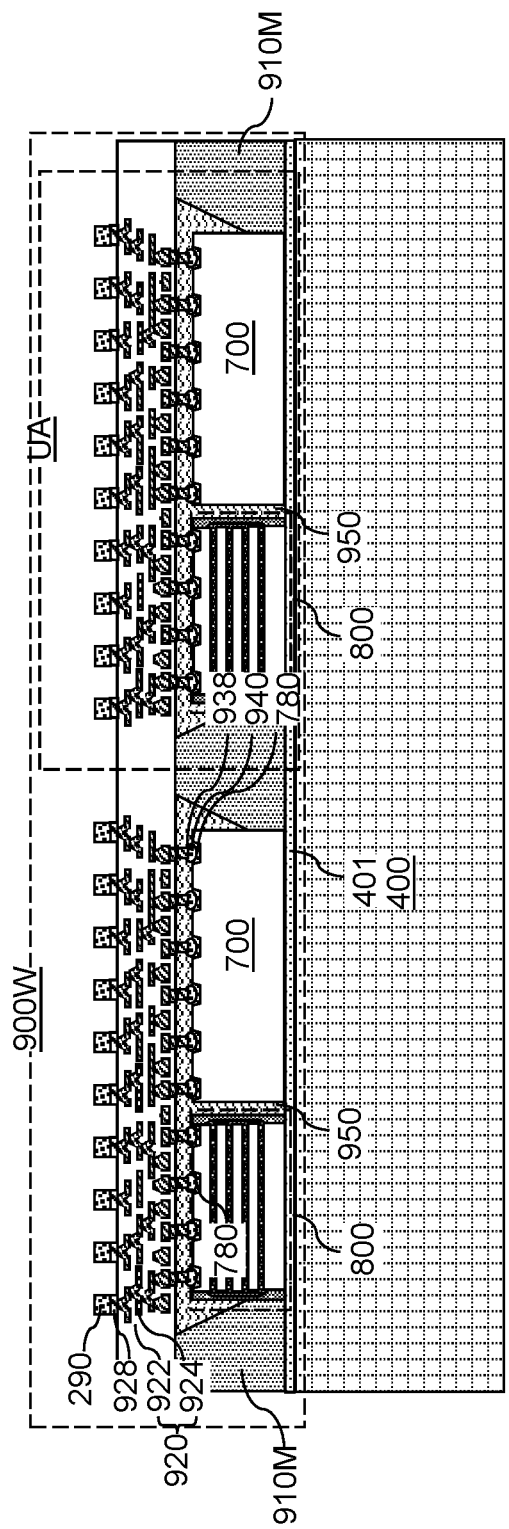
FIG. 18 is a vertical cross-sectional view of a region of the exemplary structure after formation of fan-out bonding pads according to an embodiment of the present disclosure.

Referring to FIG. 18, fan-out bonding pads 928 and second solder material portions 290 may be formed by depositing and patterning a stack of at least one metallic material that may function as metallic bumps and a solder material layer. The metallic fill material for the fan-out bonding pads 928 may include copper. Other suitable materials are within the contemplated scope of disclosure. The thickness of the fan-out bonding pads 928 may be in a range from 5 microns to 100 microns, although lesser or greater thicknesses may also be used. The fan-out bonding pads 928 and the second solder material portions 290 may have horizontal cross-sectional shapes of rectangles, rounded rectangles, or circles. Other suitable shapes are within the contemplated scope of disclosure. In embodiments in which the fan-out bonding pads 928 are formed as C4 (controlled collapse chip connection) pads, the thickness of the fan-out bonding pads 928 may be in a range from 5 microns to 50 microns, although lesser or greater thicknesses may also be used. In some embodiments, the fan-out bonding pads 928 may be, or include, under bump metallurgy (UBM) structures. The configurations of the fan-out bonding pads 928 are not limited to be fan-out structures. Alternatively, the fan-out bonding pads 928 may be configured for microbump bonding (i.e., C2 bonding), and may have a thickness in a range from 30 microns to 100 microns, although lesser or greater thicknesses may also be used. In such an embodiment, the fan-out bonding pads 928 may be formed as an array of microbumps (such as copper pillars) having a lateral dimension in a range from 10 microns to 25 microns, and having a pitch in a range from 20 microns to 50 microns.

The fan-out bonding pads 928 and the second solder material portions 290 may be formed on the opposite side of the EMC matrix 910M and the two-dimensional array of sets of semiconductor dies (700, 800) relative to the interposer layer. The interposer layer includes a three-dimensional array of interposers 920. Each interposer 920 may be located within a respective unit area UA. Each interposer 920 may include redistribution dielectric layers 922, redistribution wiring interconnects 924 embedded in the redistribution dielectric layers 922, and fan-out bonding pads 928. The fan-out bonding pads 928 may be located on an opposite side of the UBM pillars 938 relative to the redistribution dielectric layers 922, and may be electrically connected to a respective one of the UBM pillars 938.

Figure 19:
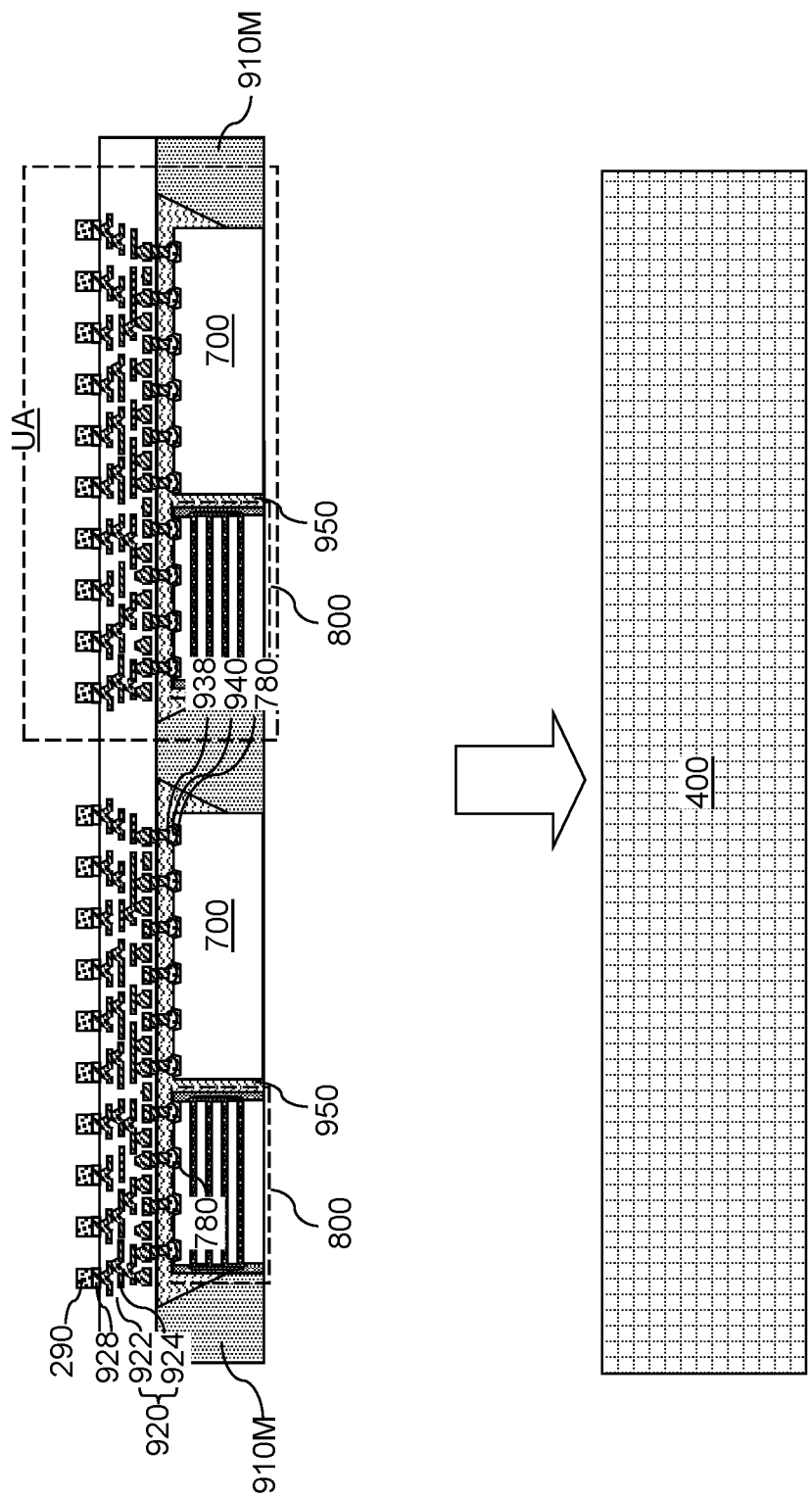
FIG. 19 is a vertical cross-sectional view of a region of the exemplary structure after detaching the second carrier substrate according to an embodiment of the present disclosure.

Referring to FIG. 19, the second adhesive layer 401 may be decomposed by ultraviolet radiation or by a thermal anneal at a debonding temperature. In embodiments in which the second carrier substrate 400 includes an optically transparent material and the second adhesive layer 401 includes an LTHC layer, the second adhesive layer 401 may be decomposed by irradiating ultraviolet light through the transparent carrier substrate. In embodiments in which the second adhesive layer 401 includes a thermally decomposing adhesive material, a thermal anneal process at a debonding temperature may be performed to detach the second carrier substrate 400 from the reconstituted wafer 900W.

Figure 20:
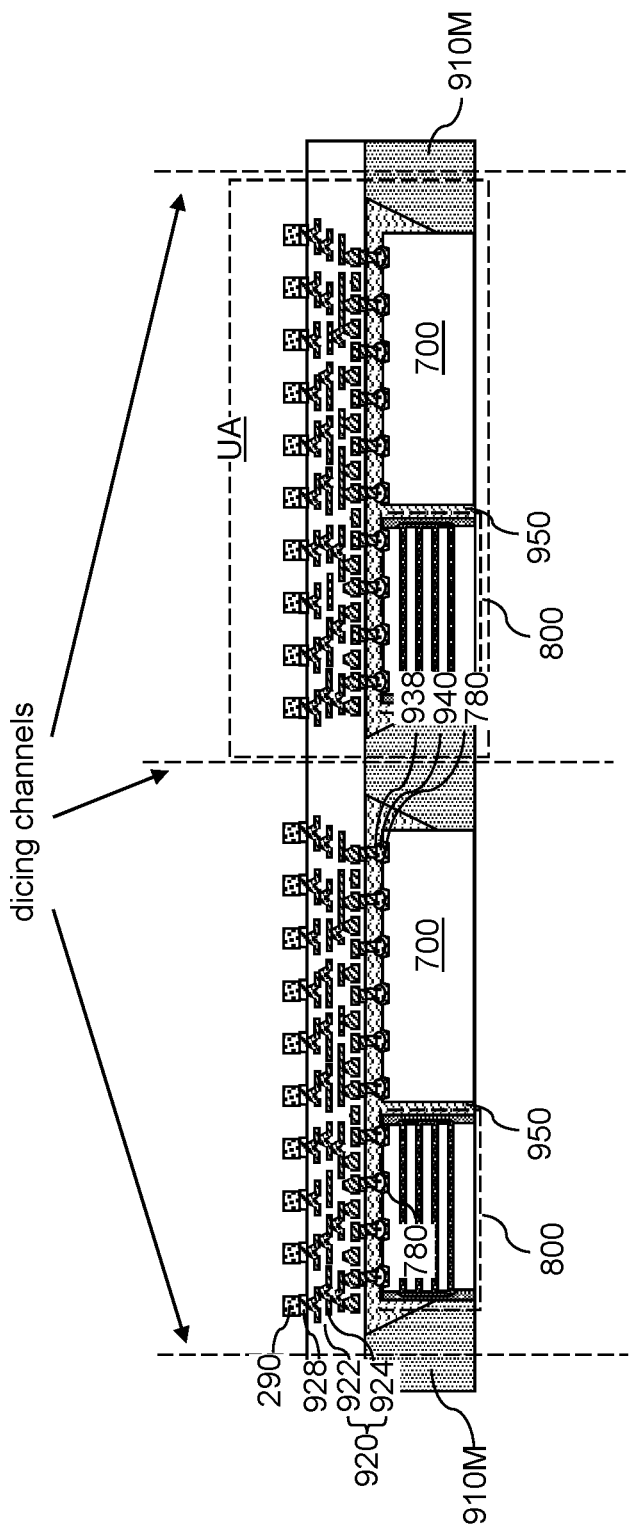
FIG. 20 is a vertical cross-sectional view of a region of the exemplary structure during dicing of a redistribution substrate and the EMC matrix according to an embodiment of the present disclosure.

Referring to FIG. 20, the reconstituted wafer 900W including the fan-out bonding pads 928 may be subsequently diced along dicing channels by performing a dicing process. The dicing channels correspond to the boundaries between neighboring pairs of die areas DA. Each diced unit from the reconstituted wafer 900W may include a fan-out package 900. In other words, each diced portion of the assembly of the two-dimensional array of sets of semiconductor dies (700, 800), the two-dimensional array of first underfill material portions 950, the EMC matrix 910M, and the two-dimensional array of interposers 920 constitutes a fan-out package 900. Each diced portion of the EMC matrix 910M constitutes a molding compound die frame 910. Each diced portion of the interposer layer (which includes the two-dimensional array of interposers 920) constitutes an interposer 920.

Figure 21A:
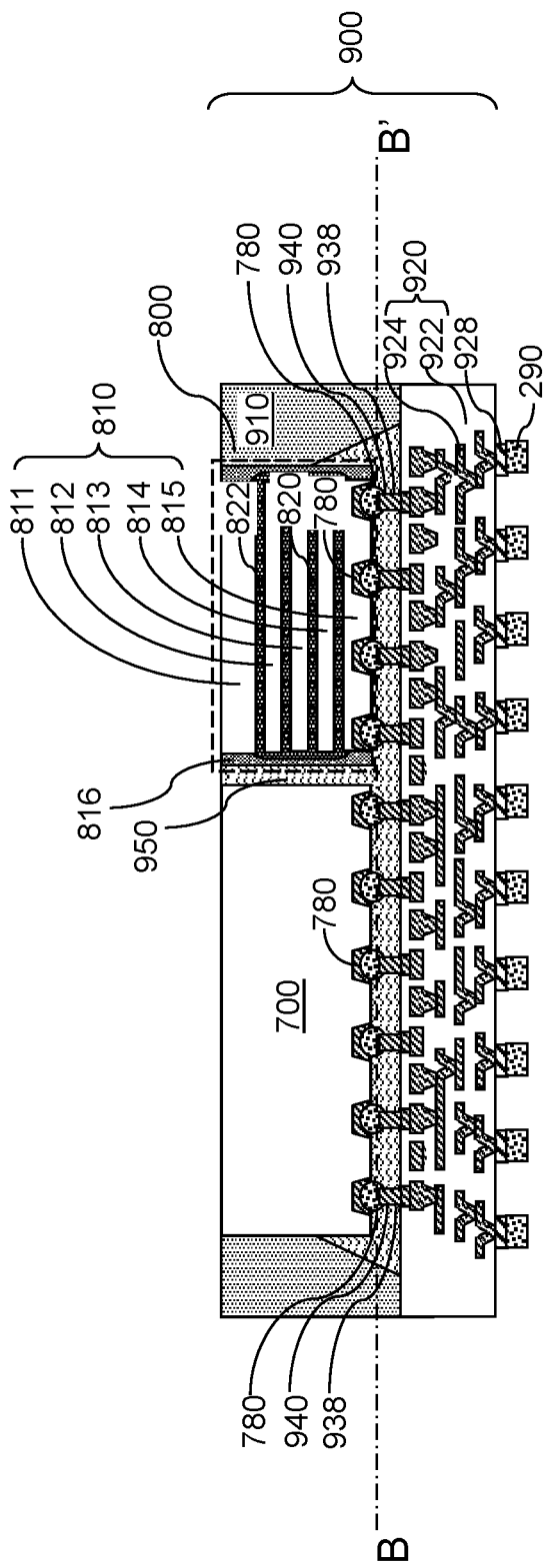
FIG. 21A is a vertical cross-sectional view of a fan-out package according to an embodiment of the present disclosure.
Figure 21B:
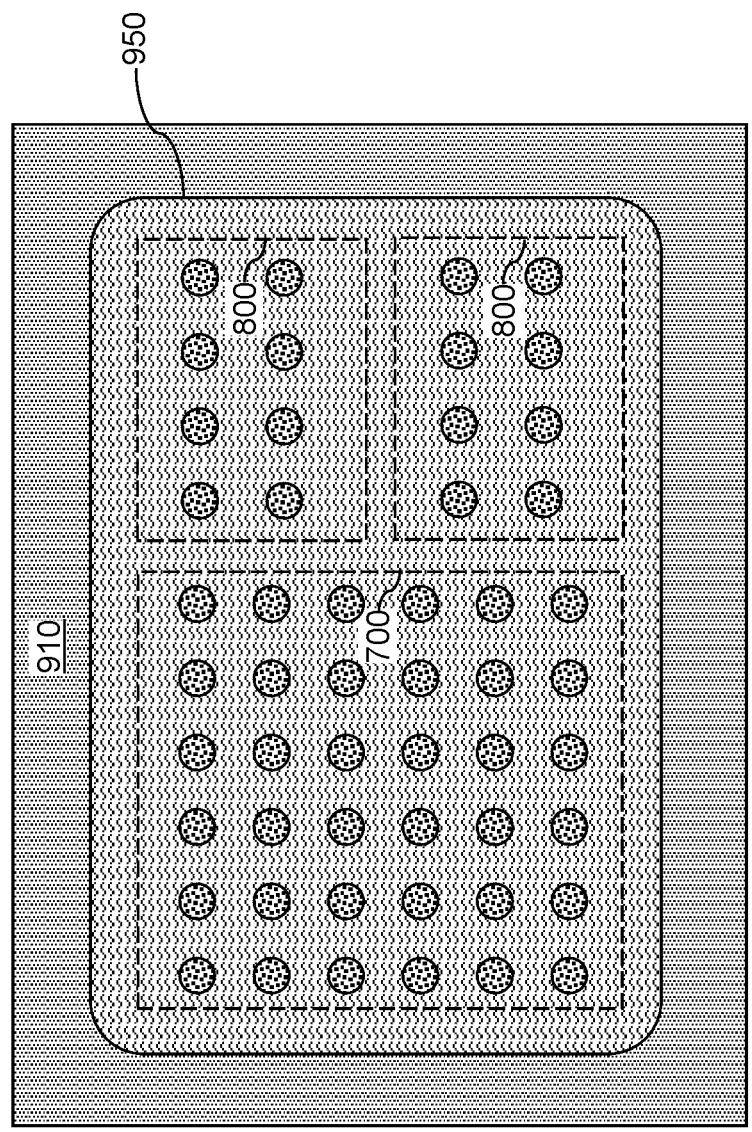
FIG. 21B is a horizontal cross-sectional view of the fan-out package along the horizontal plane B-B' of FIG. 10A.

Referring to FIGS. 21A and 21B, a fan-out package 900 obtained by dicing the exemplary structure at the processing steps of FIG. 10 is illustrated. The fan-out package 900 comprises a interposer 920 including UBM pillars 938, at least one semiconductor die (700, 800) comprising a respective set of first bonding structures (658, 780) that is attached to the UBM pillars 938 through a respective set of first solder material portions 940, a first underfill material portion 950 laterally surrounding the UBM pillars 938 and the first bonding structures (658, 780) of the at least one semiconductor die (700, 800).

The fan-out package 900 may comprise a molding compound die frame 910 laterally surrounding the at least one semiconductor die (700, 800) and comprising a molding compound material. In one embodiment, the molding compound die frame 910 may include sidewalls that are vertically coincident with sidewalls of the interposer 920, i.e., located within same vertical planes as the sidewalls of the interposer 920. Generally, the molding compound die frame 910 may be formed around the at least one semiconductor die (700, 800) after formation of the first underfill material portion 950 within each fan-out package 900. The molding compound material contacts a peripheral portion of a planar surface of the interposer 920.

Figure 22A:
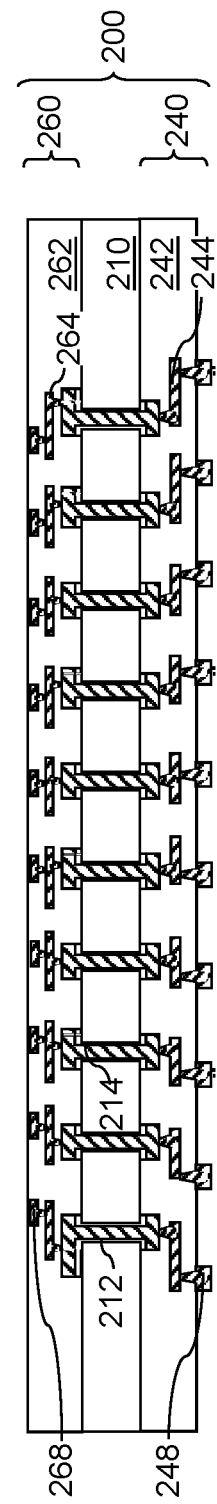
FIG. 22A is a vertical cross-sectional view of a packaging substrate according to an embodiment of the present disclosure.
Figure 22B:
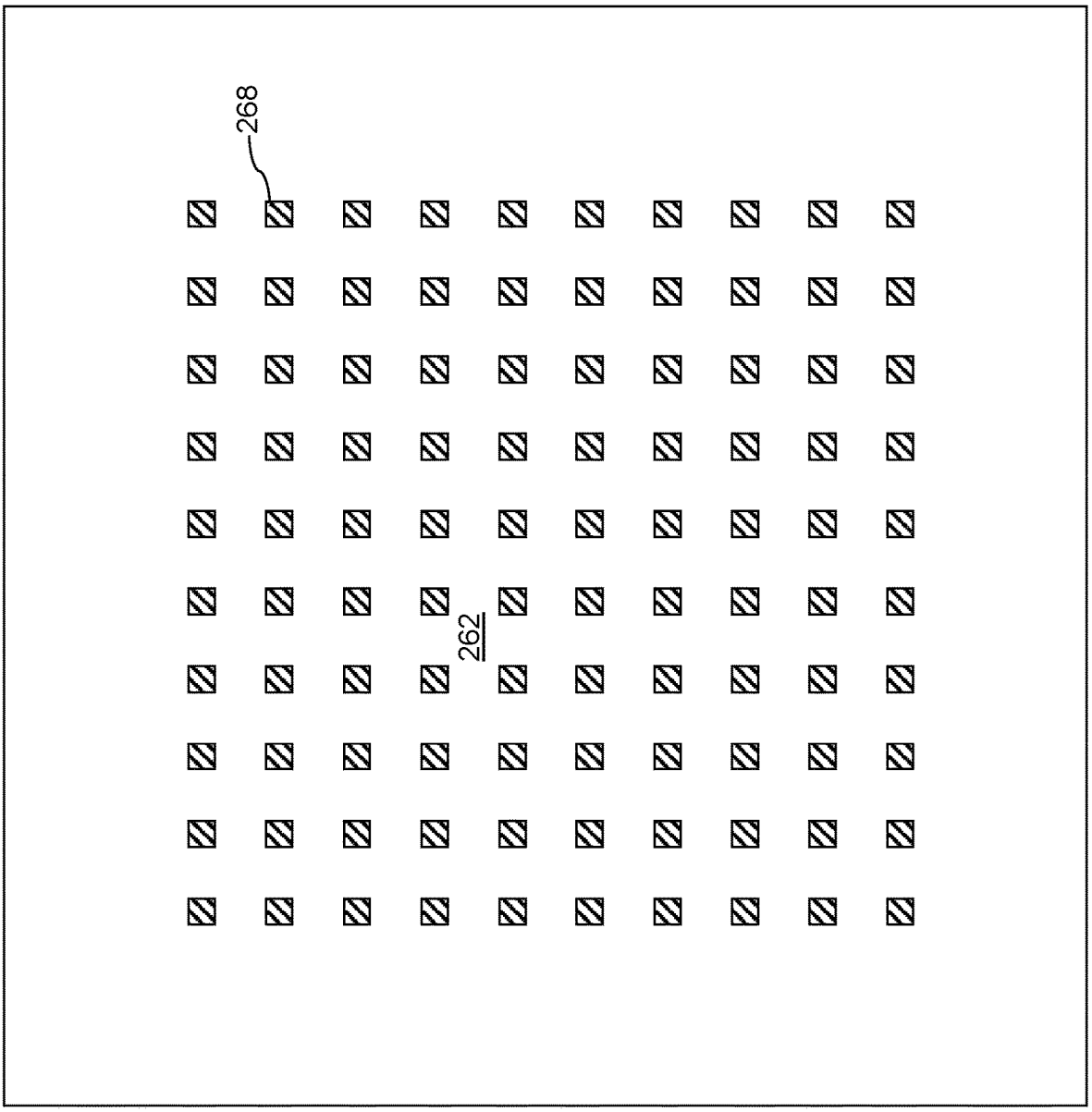
FIG. 22B is a top-down view of the packaging substrate of FIG. 22A.

Referring to FIGS. 22A and 22B, a packaging substrate 200 is provided. The packaging substrate 200 may be a cored packaging substrate including a core substrate 210, or a coreless packaging substrate that does not include a package core.

Alternatively, the packaging substrate 200 may include a system-on-integrated packaging substrate (SoIS) including redistribution layers and/or dielectric interlayers, at least one embedded interposer (such as a silicon interposer). Such a system-integrated packaging substrate may include layer-to-layer interconnections using solder material portions, microbumps, underfill material portions (such as molded underfill material portions), and/or an adhesion film. While the present disclosure is described using an exemplary substrate package, it is understood that the scope of the present disclosure is not limited by any particular type of substrate package and may include an SoIS. The core substrate 210 may include a glass epoxy plate including an array of through-plate holes. An array of through-core via structures 214 including a metallic material may be provided in the through-plate holes. Each through-core via structure 214 may, or may not, include a cylindrical hollow therein. Optionally, dielectric liners 212 may be used to electrically isolate the through-core via structures 214 from the core substrate 210.

The packaging substrate 200 may include board-side surface laminar circuit (SLC) 240 and a chip-side surface laminar circuit (SLC) 260. The board-side SLC may include board-side insulating layers 242 embedding board-side wiring interconnects 244. The chip-side SLC 260 may include chip-side insulating layers 262 embedding chip-side wiring interconnects 264. The board-side insulating layers 242 and the chip-side insulating layers 262 may include a photosensitive epoxy material that may be lithographically patterned and subsequently cured. The board-side wiring interconnects 244 and the chip-side wiring interconnects 264 may include copper that may be deposited by electroplating within patterns in the board-side insulating layers 242 or the chip-side insulating layers 262.

In one embodiment, the packaging substrate 200 includes a chip-side surface laminar circuit 260 comprising chip-side wiring interconnects 264 connected to an array of chip-side bonding pads 268 that may be bonded to the array of second solder material portions 290, and a board-side surface laminar circuit 240 including board-side wiring interconnects 244 connected to an array of board-side bonding pads 248. The array of board-side bonding pads 248 is configured to allow bonding through solder balls. The array of chip-side bonding pads 268 may be configured to allow bonding through C4 solder balls. Generally, any type of packaging substrate 200 may be used. While the present disclosure is described using an embodiment in which the packaging substrate 200 includes a chip-side surface laminar circuit 260 and a board-side surface laminar circuit 240, embodiments are expressly contemplated herein in which one of the chip-side surface laminar circuit 260 and the board-side surface laminar circuit 240 is omitted, or is replaced with an array of bonding structures such as microbumps. In an illustrative example, the chip-side surface laminar circuit 260 may be replaced with an array of microbumps or any other array of bonding structures.

Figure 23:
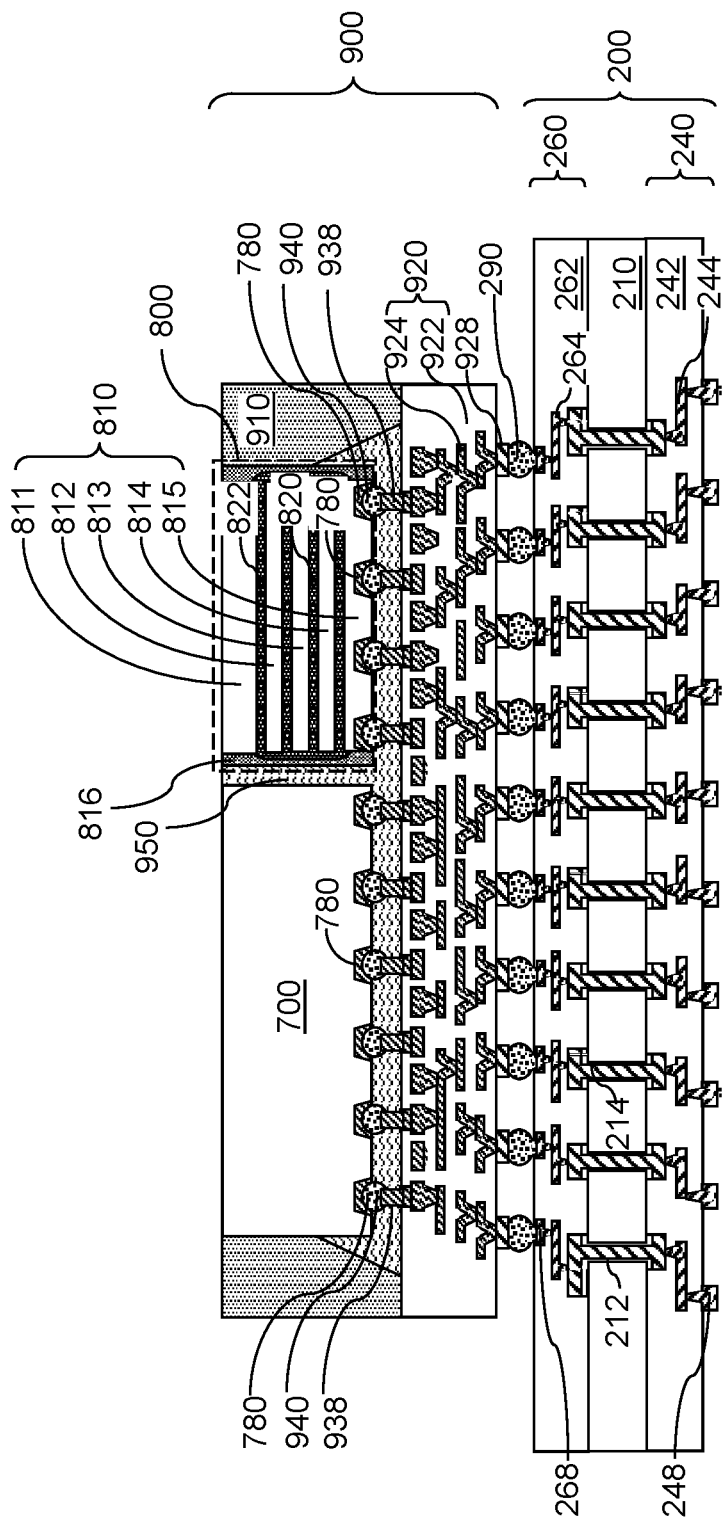
FIG. 23 is a vertical cross-sectional view of an exemplary structure after attaching the fan-out package to the packaging substrate according to an embodiment of the present disclosure.

Referring to FIG. 23, the fan-out package 900 may be disposed over the packaging substrate 200 with an array of the second solder material portions 290 therebetween. In embodiments in which the second solder material portions 290 are formed on the fan-out bonding pads 928 of the fan-out package 900, the second solder material portions 290 may be disposed on the chip-side bonding pads 268 of the packaging substrate 200. A reflow process may be performed to reflow the second solder material portions 290, thereby inducing bonding between the fan-out package 900 and the packaging substrate 200. Each second solder material portion 290 may be bonded to a respective one of the fan-out bonding pads 928 and to a respective one of the chip-side bonding pads 268. In one embodiment, the second solder material portions 290 may include C4 solder balls, and the fan-out package 900 may be attached to the packaging substrate 200 through an array of C4 solder balls. Generally, the fan-out package 900 may be bonded to the packaging substrate 200 such that the interposer 920 is bonded to the packaging substrate 200 by an array of solder material portions (such as the second solder material portions 290).

Figure 24:
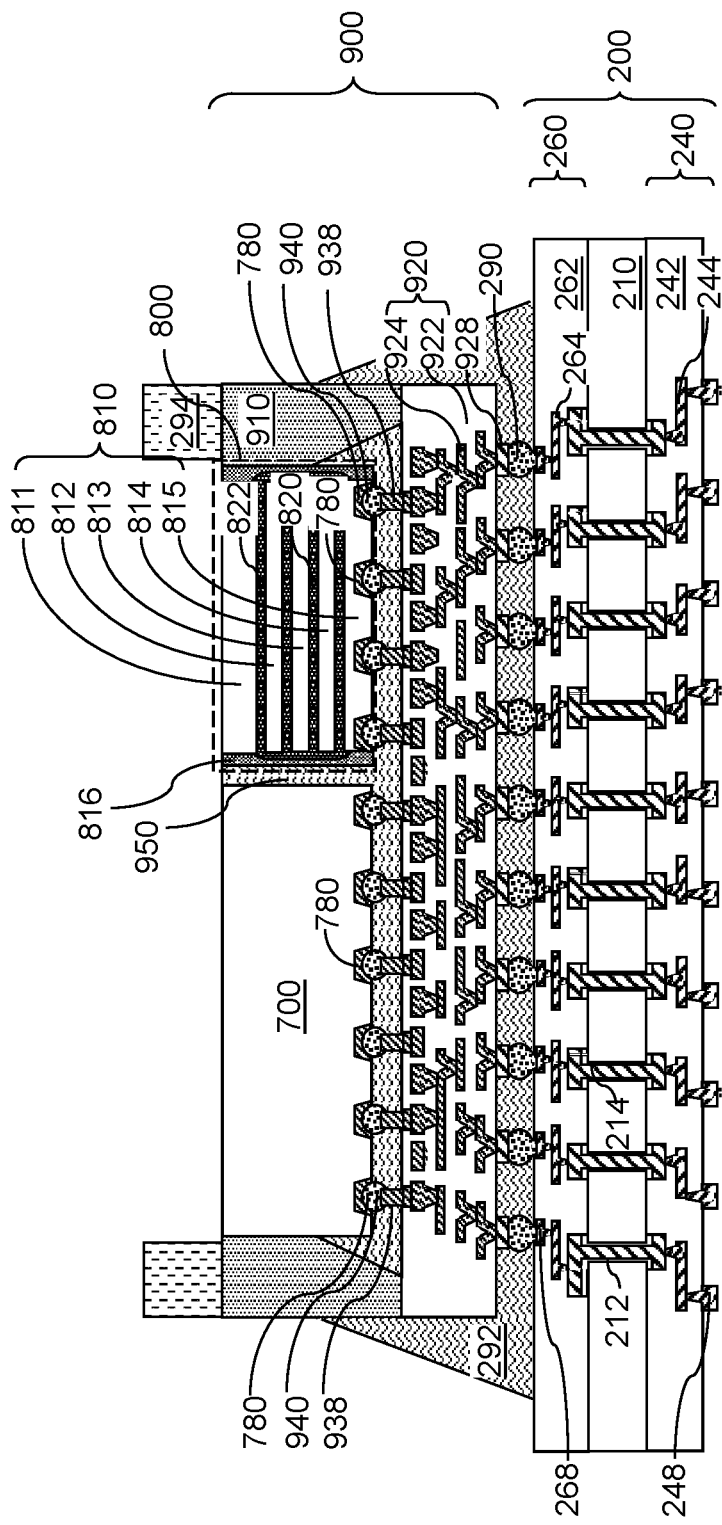
FIG. 24 is a vertical cross-sectional view of the exemplary structure after formation of a second underfill material portion according to an embodiment of the present disclosure.

Referring to FIG. 24, a second underfill material portion 292 may be formed around the second solder material portions 290 by applying and shaping a second underfill material. The second underfill material portion 292 may be formed by injecting the second underfill material around the array of second solder material portions 290 after the second solder material portions 290 are reflowed. Any known underfill material application method may be used, which may be, for example, the capillary underfill method, the molded underfill method, or the printed underfill method.

The second underfill material portion 292 may be formed between the interposer 920 and the packaging substrate 200. The second underfill material portion 292 may be formed directly on each sidewall of the molding compound die frame 910, directly on a horizontal surface of the interposer 920, and directly on a horizontal surface of the packaging substrate 200. The second underfill material portion 292 may contact each of the second solder material portions 290 (which may be C4 solder balls or C2 solder caps), and may contact vertical sidewalls of the fan-out package 900. The second underfill material portion laterally surrounds, and contacts, the array of second solder material portions 290 and the fan-out package 900.

Optionally, a stabilization structure 294, such as a cap structure or a ring structure, may be attached to the assembly of the fan-out package 900 and the packaging substrate 200 to reduce deformation of the assembly during subsequent processing steps and/or during usage of the assembly. In one embodiment, the fan-out package 900 comprises a molding compound die frame 910 that laterally surrounds the at least one semiconductor die (700, 800) and contacting a peripheral portion of a top surface of the interposer 920. The second underfill material portion 292 may be formed directly on sidewalls of the molding compound die frame 910.

Figure 25:
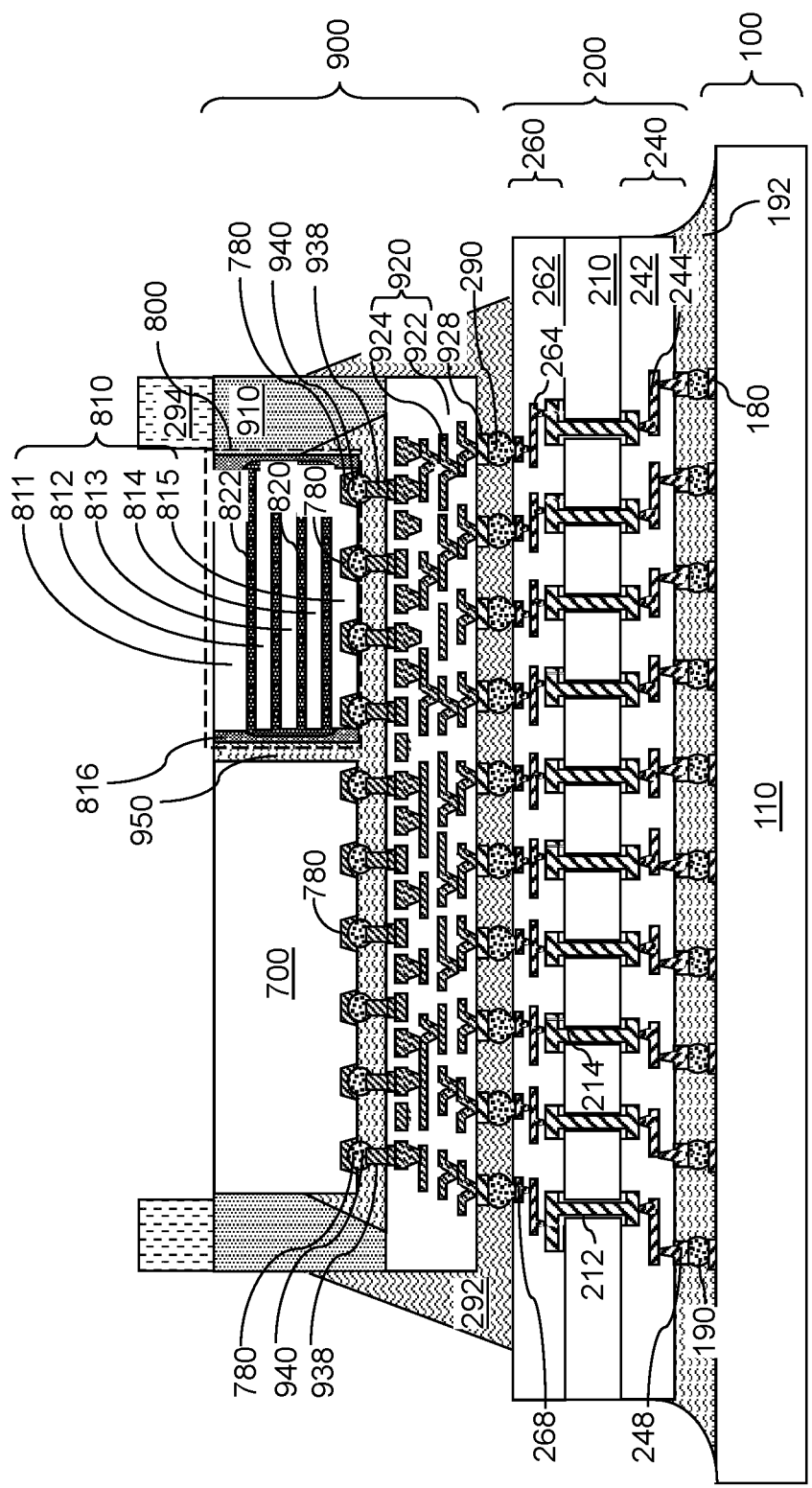
FIG. 25 is a vertical cross-sectional view of the exemplary structure after the packaging substrate is attached to a printed circuit board (PCB) according to an embodiment of the present disclosure.

Referring to FIG. 25, a printed circuit board (PCB) 100 including a PCB substrate 110 and PCB bonding pads 180 may be provided. The PCB 100 includes a printed circuitry (not shown) at least on one side of the PCB substrate 110. An array of solder joints 190 may be formed to bond the array of board-side bonding pads 248 to the array of PCB bonding pads 180. The solder joints 190 may be formed by disposing an array of solder balls between the array of board-side bonding pads 248 and the array of PCB bonding pads 180, and by reflowing the array of solder balls. An underfill material portion 192 may be formed around the solder joints 190 by applying and shaping an underfill material. The packaging substrate 200 is attached to the PCB 100 through the array of solder joints 190.

Figure 26:
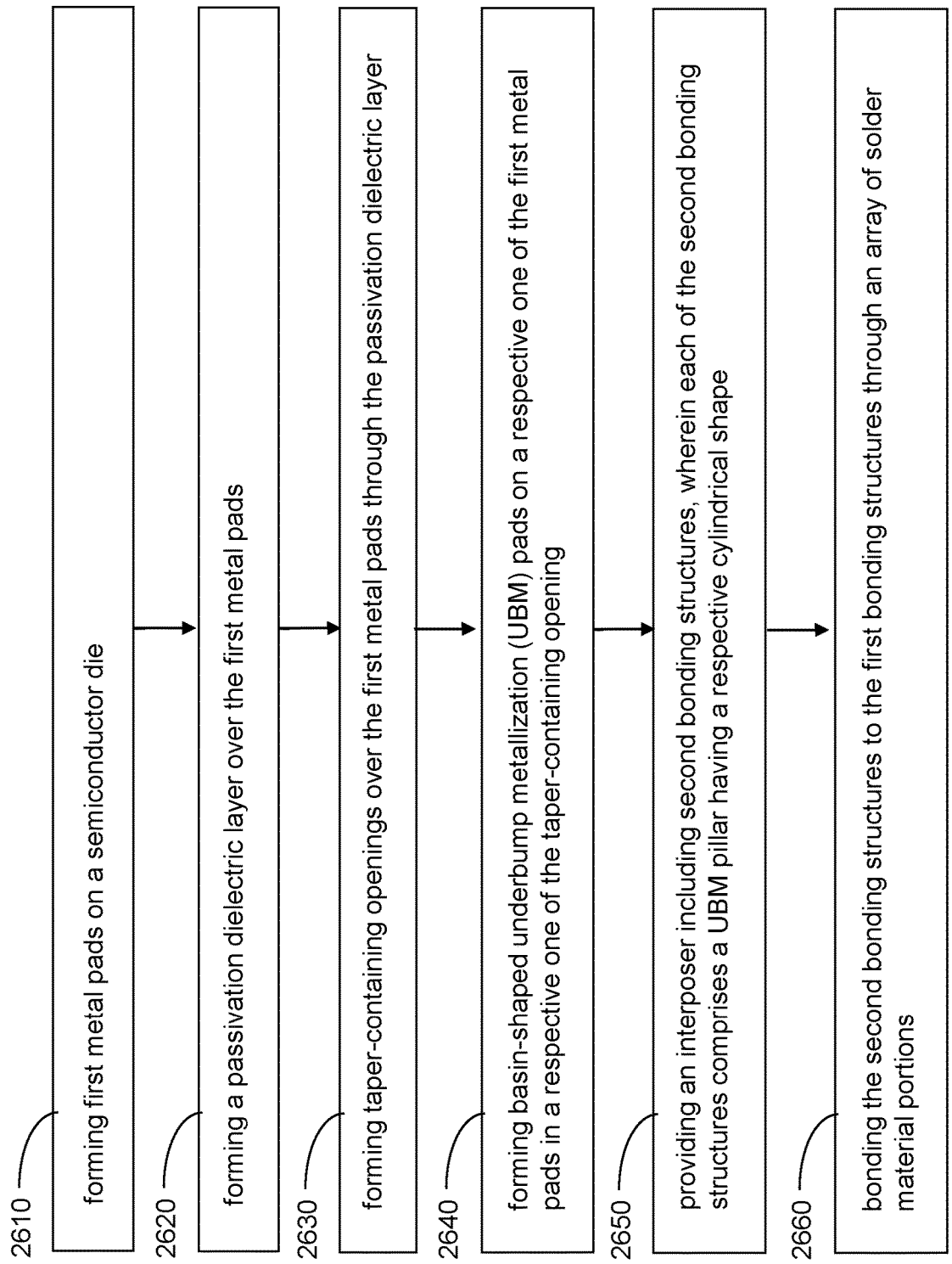
FIG. 26 is a flowchart illustrating steps for forming a semiconductor structure according to an embodiment of the present disclosure.

Referring to FIG. 26, a flowchart illustrates steps for forming a semiconductor structure according to an embodiment of the present disclosure.

Referring to step 2610 and FIGS. 1A, 1B, and 7, first metal pads 658 are formed on a semiconductor die.

Referring to step 2620 and FIGS. 1A, 1B, and 7, a passivation dielectric layer 660 is formed over the first metal pads 658.

Referring to step 2630 and FIGS. 1A, 1B, 7, and 8, taper-containing openings 661 are formed over the first metal pads 658 through the passivation dielectric layer 660.

Referring to step 2640 and FIGS. 2-5, 9, 10A-10D, and 11A-11L, basin-shaped underbump metallization (UBM) pads 780 may be formed on a respective one of the first metal pads 658 in a respective one of the taper-containing openings 661. Each contiguous combination of a first metal pad 658 selected from the first metal pads 658 and a basin-shaped UBM pad 780 selected from the basin-shaped UBM pads 780 constitute a first bonding structure (658, 780).

Referring to step 2650 and FIGS. 12A, 12B, 13A, and 13B, an interposer 920 including second bonding structures (924P, 938) may be provided. Each of the second bonding structures (924P, 938) comprises an underbump metallization (UBM) pillar 938 having a respective cylindrical shape.

Referring to step 2660 and FIGS. 14A-25, the second bonding structures (924P, 938) are bonded to the first bonding structures (658, 780) through an array of solder material portions 940.

Referring to all drawings and according to various embodiments of the present disclosure, a semiconductor structure is provided, which may include: a semiconductor die (700 or 800) comprising an array of first bonding structures (658, 780), wherein at least one of the first bonding structures (658, 780) includes a first metal pad 658 located within a first dielectric material layer (such as a bonding-level dielectric material layer 650) and a basin-shaped underbump metallization (UBM) pad 780 located within a respective opening in the passivation dielectric layer 660 and contacting the first metal pad 658; an interposer 920 including an array of second bonding structures (924P, 938), wherein a corresponding one of the second bonding structures (924P, 938) comprises an underbump metallization (UBM) pillar 938 having a respective cylindrical shape; and an array of solder material portions 940 bonded to a respective one of the first bonding structures (658, 780) and to a respective one of the second bonding structures (924P, 938).

In one embodiment, the basin-shaped UBM pad 780 within the at least one of the first bonding structures (658, 780) may include a layer stack including: a copper plate 664 in contact with a respective one of the solder material portions 940; and a non-copper metallization material plate 662 in contact with the copper plate 664. In one embodiment, the basin-shaped UBM pad 780 may include at least one tapered surface that contacts a respective tapered surface segment 780T of the passivation dielectric layer 660. In one embodiment, a horizontal surface of the first metal pad of the at least one of the first bonding structures may include: a first horizontal surface segment in contact with a horizontal bottom surface 780H of the basin-shaped UBM pad within a respective one of the first bonding structures (658, 780); and a second horizontal surface segment that is complement of the first horizontal surface segment and is in contact with a surface segment of the passivation dielectric layer 660. In one embodiment, the UBM pillar 938 within the corresponding one of the second bonding structures (930, 932, 934) comprises a stack of a capping copper pedestal 934 and a non-copper metallization material pedestal 932 that have a same horizontal cross-sectional area. In one embodiment, the corresponding one of the second bonding structures (930, 932, 934) comprises a second metal pad 924P laterally surrounded by a second dielectric material layer 922; and the UBM pillar 938 within the corresponding one of the second bonding structures (930, 932, 934) comprises a base copper pedestal 930 disposed between the non-copper metallization material pedestal 932 and a respective one of the second metal pads 924P. In one embodiment, the UBM pillar 938 within the corresponding one of the second bonding structures (930, 932, 934) has a uniform horizontal cross-sectional view that is invariant with a translation along a vertical direction. In one embodiment, the basin-shaped UBM pad 780 within the at least one of the first bonding structures (658, 780) may include: a horizontally-extending portion 780H having a uniform thickness and contacting the respective one of the first metal pads 658; and a taper-containing portion 780T adjoined to a periphery of the horizontally-extending portion 780P and contacting at least one tapered surface segment of the passivation dielectric layer 660 that is a respective tapered portion of a contoured surface of the passivation dielectric layer 660. In one embodiment, the UBM pillar 938 within the corresponding one of the second bonding structures (930, 932, 934) has a maximum lateral extent of a first dimension; the horizontally-extending portion 780H of the basin-shaped UBM pad 780 within the corresponding one of the first bonding structures (658, 780) has a maximum lateral extent of a second dimension; and a ratio of the second dimension to the first dimension is in a range from 1.0 to 2.0. In one embodiment, the basin-shaped UBM pad 780 within the at least one of the first bonding structures (658, 780) may include a peripheral plate portion 780P adjoined to an outer periphery of the taper-containing portion 780T and contacting an annular segment of a horizontally-extending portion of the contoured surface of the passivation dielectric layer 660; an inner periphery of the peripheral plate portion 780P of the basin-shaped UBM pad 780 is adjoined to a periphery of the taper-containing portion of the basin-shaped UBM pad 780 and has a maximum lateral extent of a third dimension; and a ratio of the third dimension to the second dimension is in a range from 1.1 to 2.0. In one embodiment, a straight tapered surface extends from the periphery of the horizontally-extending portion 780H of the basin-shaped UBM pad 780 to the inner periphery of the peripheral plate portion 780P of the basin-shaped UBM pad 780. In one embodiment, a stepped surface extends from the periphery of the horizontally-extending portion 780H of the basin-shaped UBM pad 780 to the inner periphery of the peripheral plate portion 780P of the basin-shaped UBM pad 780; and the stepped surface comprises two tapered annular surfaces adjoined to each other through a horizontal annular surface.

According to another aspect of the present disclosure, a semiconductor structure is provided, which may include: a semiconductor die (700 or 800) that includes die-side bonding structures (658, 780), wherein the die-side bonding structures (658, 780) includes first-type bonding structures and second-type bonding structures, wherein each of the first-type bonding structures and second-type bonding structures comprises a respective first metal pad 658 located within a first dielectric material layer (such as a bonding-level dielectric material layer 650) and a respective basin-shaped underbump metallization (UBM) pad 780 located within a respective opening in a passivation dielectric layer 660 (that overlies or underlies the dielectric material layer depending on the orientation of the semiconductor structure) and contacting the respective first metal pad 658, wherein each basin-shaped UBM pad 780 within the first-type bonding structures has a first shape in a plan view along a vertical direction that is perpendicular to a horizontal surface of the first dielectric material layer, and wherein each basin-shaped UBM pad 780 within the second-type bonding structures has a second shape in the plan view, the second shape being different from the first shape; an interposer 920 comprising an array of second bonding structures (924P, 938), wherein each of the second bonding structures (924P, 938) comprises an underbump metallization (UBM) pillar 938 having a respective cylindrical shape; and an array of solder material portions 940 bonded to a respective one of the die-side bonding structures (658, 780) and to a respective one of the second bonding structures (924, 938).

In one embodiment, each of the first shape and the second shape may be independently selected from a circle, an oval, and polygons. In one embodiment, the first-type bonding structures may be arranged as a rectangular periodic array; and the second-type bonding structures may be arranged around, and encircles, the rectangular periodic array.

The various embodiments of the present disclosure may be used to provide a high-density C2 bonding array, which may be used to attach at least one semiconductor die (700, 800) to an interposer 920 with enhanced process yield and with improved reliability. In some embodiments, the UBM pillars 938 may be self-aligned within a concave volume defined by inner surfaces of the basin-shaped UBM pads 780, and the lateral extent of each solder material portion 940 is therefore controlled.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor structure comprising:
a semiconductor die comprising an array of first bonding structures, wherein at least one of the first bonding structures comprises a first metal pad located within a first dielectric material layer and a basin-shaped underbump metallization (UBM) pad located within a respective opening in a passivation dielectric layer that overlies the first dielectric material layer and contacting the first metal pad, wherein the passivation dielectric layer has a same dielectric material composition throughout and comprises a passivation dielectric material selected from silicon nitride and photosensitive polyimide and contacting a peripheral top surface segment of the first metal pad, and wherein the basin-shaped UBM pad comprises a bottommost surface contacting a center top surface segment of the first metal pad, a first tapered annular surface contacting a first tapered surface segment of the passivation dielectric material and adjoined to a periphery of the bottommost surface, a first horizontal annular surface contacting a first horizontal annular surface segment of the passivation dielectric material and adjoined to a top periphery of the first tapered annular surface, a second tapered annular surface contacting a second tapered surface segment of the passivation dielectric material and adjoined to an outer periphery of the first horizontal annular surface, and a second horizontal annular surface contacting a second horizontal annular surface segment of the passivation dielectric material;
an interposer comprising an array of second bonding structures, wherein a corresponding one of the second bonding structures comprises an UBM pillar having a respective cylindrical shape; and
an array of solder material portions bonded to a respective one of the first bonding structures and to a respective one of the second bonding structures.

2. The semiconductor structure of claim 1, wherein the basin-shaped UBM pad within the at least one of the first bonding structures comprises a layer stack including:
a copper plate in contact with a respective one of the solder material portions; and
a non-copper metallization material plate in contact with the copper plate.

3. The semiconductor structure of claim 1, wherein the UBM pillar within the corresponding one of the second bonding structures comprises a stack of a capping copper pedestal and a non-copper metallization material pedestal that have a same horizontal cross-sectional area.

4. The semiconductor structure of claim 3, wherein:
the corresponding one of the second bonding structures comprises a second metal pad laterally surrounded by a second dielectric material layer; and
the UBM pillar within the corresponding one of the second bonding structures comprises a base copper pedestal disposed between the non-copper metallization material pedestal and a respective one of the second metal pads.

5. The semiconductor structure of claim 1, wherein the UBM pillar within the corresponding one of the second bonding structures has a uniform horizontal cross-sectional view that is invariant with a translation along a vertical direction.

6. The semiconductor structure of claim 1, wherein the basin-shaped UBM pad within the at least one of the first bonding structures comprises:
a horizontally-extending portion having a uniform thickness and contacting the respective one of the first metal pads; and
a taper-containing portion adjoined to a periphery of the horizontally-extending portion and contacting at least one tapered surface segment of the passivation dielectric layer that is a respective tapered portion of a contoured surface of the passivation dielectric layer.

7. The semiconductor structure of claim 6, wherein:
the UBM pillar within the corresponding one of the second bonding structures has a maximum lateral extent of a first dimension;
the horizontally-extending portion of the basin-shaped UBM pad within the at least one of the first bonding structures has a maximum lateral extent of a second dimension; and
a ratio of the second dimension to the first dimension is in a range from 1.0 to 2.0.

8. The semiconductor structure of claim 6, wherein:
the basin-shaped UBM pad within the at least one of the first bonding structures comprises a peripheral plate portion adjoined to an outer periphery of the taper-containing portion and contacting the second horizontal annular surface segment of the passivation dielectric material;
an inner periphery of the second horizontal annular surface segment of the passivation dielectric material is adjoined to a periphery of the taper-containing portion of the basin-shaped UBM pad and has a maximum lateral extent of a third dimension; and
a ratio of the third dimension to the second dimension is in a range from 1.1 to 2.0.

9. The semiconductor structure of claim 8, wherein:
a stepped surface extends from the periphery of the horizontally-extending portion of the basin-shaped UBM pad to the inner periphery of the second horizontal annular surface segment of the passivation dielectric material; and
the stepped surface comprises the first tapered surface segment of the passivation dielectric material, the second tapered surface segment of the passivation dielectric material, and the first horizontal annular surface segment of the passivation dielectric material.

10. A semiconductor structure comprising:
a semiconductor die comprising an array of first bonding structures, wherein at least one of the first bonding structures comprises a first metal pad located within a first dielectric material layer and a basin-shaped underbump metallization (UBM) pad located within a respective opening in a passivation dielectric layer that overlies the first dielectric material layer and contacting the first metal pad, wherein the passivation dielectric layer has a same dielectric material composition throughout and comprises a passivation dielectric material selected from silicon nitride and photosensitive polyimide and contacting a peripheral top surface segment of the first metal pad, and wherein the basin-shaped UBM pad comprises a bottommost surface contacting a center top surface segment of the first metal pad, a first tapered annular surface contacting a first tapered surface segment of the passivation dielectric material and adjoined to a periphery of the bottommost surface, a first horizontal annular surface contacting a first horizontal annular surface segment of the passivation dielectric material and adjoined to a top periphery of the first tapered annular surface, a second tapered annular surface contacting a second tapered surface segment of the passivation dielectric material and adjoined to an outer periphery of the first horizontal annular surface, and a second horizontal annular surface contacting a second horizontal annular surface segment of the passivation dielectric material;
an interposer comprising an array of second bonding structures, wherein a corresponding one of the second bonding structures comprises an UBM pillar having a respective cylindrical shape; and
an array of solder material portions bonded to a respective one of the first bonding structures and to a respective one of the second bonding structures,
wherein the basin-shaped UBM pad comprises at least one tapered surface that contacts a respective tapered surface segment of the passivation dielectric layer.

11. The semiconductor structure of claim 10, wherein the UBM pillar within the corresponding one of the second bonding structures comprises a stack of a capping copper pedestal and a non-copper metallization material pedestal that have a same horizontal cross-sectional area.

12. The semiconductor structure of claim 10, wherein:
the corresponding one of the second bonding structures comprises a second metal pad laterally surrounded by a second dielectric material layer; and
the UBM pillar within the corresponding one of the second bonding structures comprises a base copper pedestal disposed between the non-copper metallization material pedestal and a respective one of the second metal pads.

13. The semiconductor structure of claim 10, wherein the UBM pillar within the corresponding one of the second bonding structures has a uniform horizontal cross-sectional view that is invariant with a translation along a vertical direction.

14. A semiconductor structure comprising:
a semiconductor die comprising a first metal pad located within a first dielectric material layer and a basin-shaped underbump metallization (UBM) pad located within a respective opening in a passivation dielectric layer that overlies the first dielectric material layer and contacting the first metal pad, wherein the passivation dielectric layer has a same dielectric material composition throughout and comprises a passivation dielectric material selected from silicon nitride and photosensitive polyimide and contacting a peripheral top surface segment of the first metal pad, and wherein the basin-shaped UBM pad comprises a bottommost surface contacting a center top surface segment of the first metal pad, a first tapered annular surface contacting a first tapered surface segment of the passivation dielectric material and adjoined to a periphery of the bottommost surface, a first horizontal annular surface contacting a first horizontal annular surface segment of the passivation dielectric material and adjoined to a top periphery of the first tapered annular surface, a second tapered annular surface contacting a second tapered surface segment of the passivation dielectric material and adjoined to an outer periphery of the first horizontal annular surface, and a second horizontal annular surface contacting a second horizontal annular surface segment of the passivation dielectric material, and wherein the outer periphery of the first horizontal annular surface is self-aligned to an inner periphery of the first horizontal annular surface such that the outer periphery of the first horizontal annular surface is laterally offset outward from the inner periphery of the first horizontal annular surface by a uniform lateral offset distance for each point in the outer periphery of the first horizontal annular surface in a plan view;
an interposer comprising a second bonding structures which comprises an UBM pillar having a cylindrical shape; and a solder material portions bonded to the first bonding structure and to the second bonding structure.

15. The semiconductor structure of claim 1, wherein the outer periphery of the first horizontal annular surface is laterally offset outward from an inner periphery of the first horizontal annular surface by a uniform lateral offset distance in a plan view.

16. The semiconductor structure of claim 15, wherein the passivation dielectric layer has a uniform thickness throughout within all areas of the passivation dielectric layer in the plan view that exclude areas of the openings through the passivation dielectric layer.

17. The semiconductor structure of claim 10, wherein the outer periphery of the first horizontal annular surface is laterally offset outward from an inner periphery of the first horizontal annular surface by a uniform lateral offset distance in a plan view.

18. The semiconductor structure of claim 16, wherein the passivation dielectric layer has a uniform thickness throughout within all areas of the passivation dielectric layer in the plan view that exclude areas of the openings through the passivation dielectric layer.

19. The semiconductor structure of claim 14, wherein:
the passivation dielectric layer is located entirely above a first horizontal plane including the peripheral top surface segment of the first metal pad; and
the passivation dielectric layer has a uniform thickness throughout within all areas of the passivation dielectric layer in a plan view that exclude areas of the openings through the passivation dielectric layer.

20. The semiconductor structure of claim 19, wherein the second horizontal annular surface of the basin-shaped UBM pad is located within a second horizontal plane including a topmost horizontal surface of the passivation dielectric layer, the uniform thickness being a vertical distance between the first horizontal plane and the second horizontal plane.

* * * * *